US012785033B2

(12) United States Patent
Yamamoto et al.

(10) Patent No.: US 12,785,033 B2
(45) Date of Patent: Nov. 3, 2026

(54) CHARGED PARTICLE BEAM DEVICE

(71) Applicant: Hitachi High-Tech Corporation, Tokyo (JP)

(72) Inventors: Hiroyuki Yamamoto, Tokyo (JP); Takeshi Ohmori, Tokyo (JP); Masaru Kurihara, Tokyo (JP); Keiichiro Hitomi, Tokyo (JP); Shunya Tanaka, Tokyo (JP); Hirofumi Sato, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 325 days.

(21) Appl. No.: 18/681,404

(22) PCT Filed: Aug. 16, 2021

(86) PCT No.: PCT/JP2021/029862

§ 371 (c)(1),
(2) Date: Feb. 5, 2024

(87) PCT Pub. No.: WO2023/021540

PCT Pub. Date: Feb. 23, 2023

(65) Prior Publication Data

US 2025/0132123 A1 Apr. 24, 2025

(51) Int. Cl.
*H01J 37/22* (2006.01)
*G06T 7/00* (2017.01)
(Continued)

(52) U.S. Cl.
CPC .......... *H01J 37/222* (2013.01); *G06T 7/0004* (2013.01); *H01J 37/153* (2013.01);
(Continued)

(58) Field of Classification Search
CPC . G06T 2207/10061; G06T 2207/10056; G06T 2207/20081; G06T 2207/30208;
(Continued)

(56) References Cited

U.S. PATENT DOCUMENTS 7,838,834 B2 * 11/2010 Nagaoki .............. H01J 37/222 250/311
10,114,368 B2 * 10/2018 Greenberg ....... G05B 19/41875
(Continued)

FOREIGN PATENT DOCUMENTS

JP 2011-129458 A 6/2011

OTHER PUBLICATIONS

International Search Report (PCT/ISA/210) issued in PCT Application No. PCT/JP2021/029862 dated Oct. 12, 2021 with English translation (4 pages).
(Continued)

*Primary Examiner* — Wyatt A Stoffa
(74) *Attorney, Agent, or Firm* — Crowell & Moring LLP

(57) ABSTRACT

An imaging device is provided with a sample stage configured to be capable of transferring a sample by at least two drive shafts, and shifting an imaging field of view corresponding to positional information of the sample, the positional information being obtained by a computer system. The computer system includes a classifier which outputs, in response to input of image data of a tilt image where the sample is imaged in an inclined state with respect to a charged particle beam, positional information of one or more feature parts existing on the tilt image. The classifier is trained in advance by using training data in which input is image data of the tilt image, and output is positional information of the feature part. The computer system executes, with respect to new tilt image data inputted into the classifier, a processing to output positional information of the feature part.

17 Claims, 21 Drawing Sheets

(51) Int. Cl.
*H01J 37/153* (2006.01)
*H01J 37/20* (2006.01)
*H01J 37/21* (2006.01)
*H01J 37/28* (2006.01)

(52) U.S. Cl.
CPC .............. *H01J 37/20* (2013.01); *H01J 37/21* (2013.01); *H01J 37/28* (2013.01); *G06T 2207/10061* (2013.01); *G06T 2207/20081* (2013.01); *G06T 2207/30208* (2013.01); *H01J 2237/1532* (2013.01); *H01J 2237/20207* (2013.01); *H01J 2237/20214* (2013.01); *H01J 2237/221* (2013.01)

(58) Field of Classification Search
CPC .. H01J 37/20; H01J 37/21; H01J 37/26; H01J 37/28; H01J 37/261; H01J 2237/2817; H01J 2237/20207; H01J 2237/221
See application file for complete search history.

(56) References Cited

U.S. PATENT DOCUMENTS

| | | | | |
|---|---|---|---|---|
| 10,901,402 | B2 * | 1/2021 | Greenberg | G05B 19/41875 |
| 10,903,043 | B2 * | 1/2021 | Schoenmakers | G06N 3/0464 |
| 11,132,788 | B2 * | 9/2021 | Dou | G06T 7/001 |
| 2007/0201739 | A1 * | 8/2007 | Nakagaki | G06T 7/0004<br>382/149 |
| 2008/0224040 | A1 * | 9/2008 | Nagaoki | H01J 37/26<br>250/311 |
| 2017/0109607 | A1 * | 4/2017 | Nagatomo | G06T 7/74 |
| 2018/0005363 | A1 * | 1/2018 | Nagatomo | G01B 15/00 |
| 2019/0204749 | A1 * | 7/2019 | Tel | G03F 7/705 |
| 2019/0287230 | A1 * | 9/2019 | Lu | G06N 3/045 |
| 2019/0287761 | A1 * | 9/2019 | Schoenmakers | G06N 3/0464 |
| 2020/0074611 | A1 * | 3/2020 | Dou | G06T 7/001 |
| 2020/0279362 | A1 * | 9/2020 | Miller | G06V 10/454 |
| 2021/0407761 | A1 * | 12/2021 | Maeda | H01J 37/22 |
| 2022/0114387 | A1 * | 4/2022 | Amthor | G06V 10/7515 |
| 2022/0301811 | A1 * | 9/2022 | Fang | G01N 23/2251 |
| 2023/0122101 | A1 * | 4/2023 | Kim | G06T 7/70<br>250/307 |

OTHER PUBLICATIONS

Japanese-language Written Opinion (PCT/ISA/237) issued in PCT Application No. PCT/JP2021/029862 dated Oct. 12, 2021 with English translation (5 pages).

* cited by examiner

[FIG. 1]
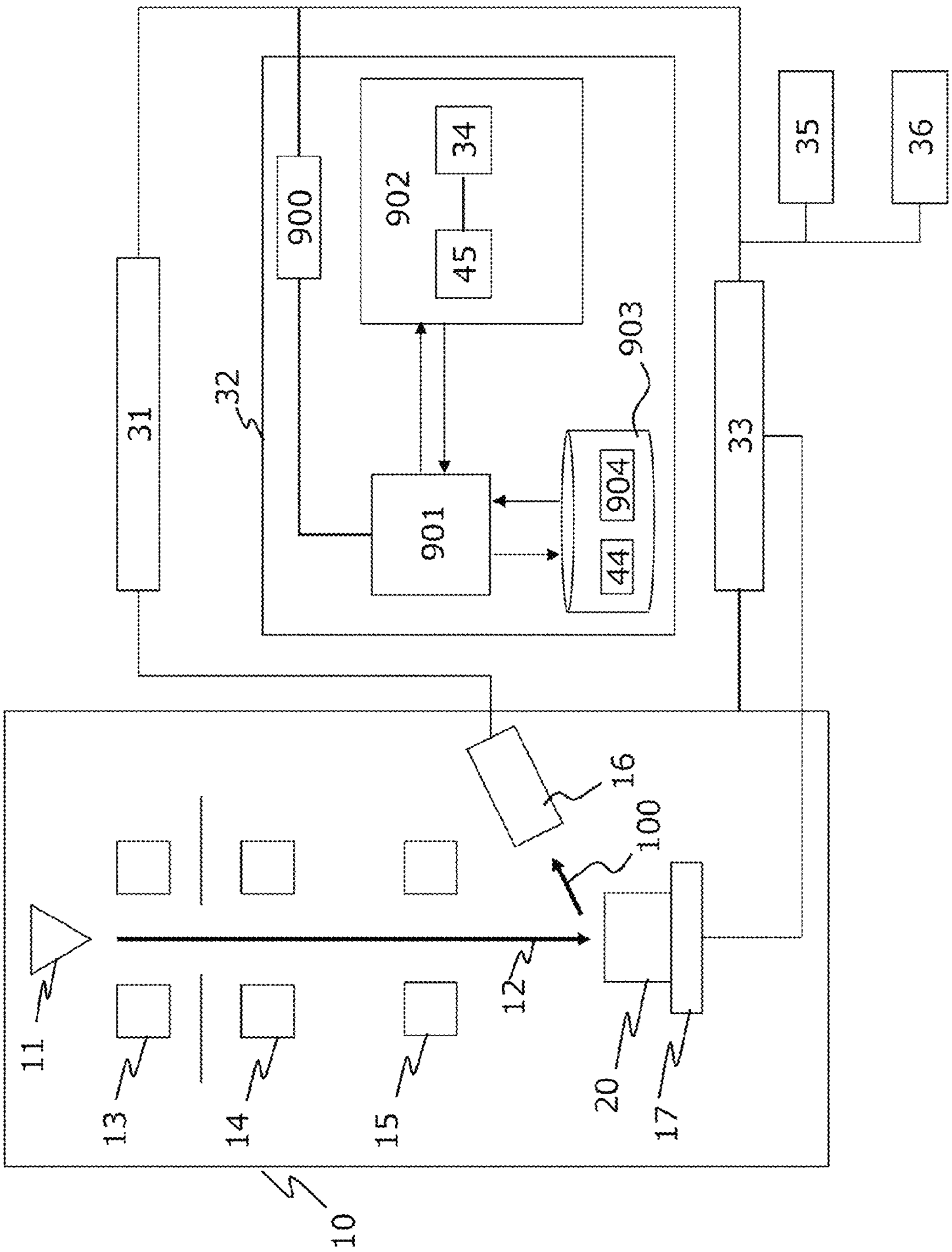

[FIG. 2A]
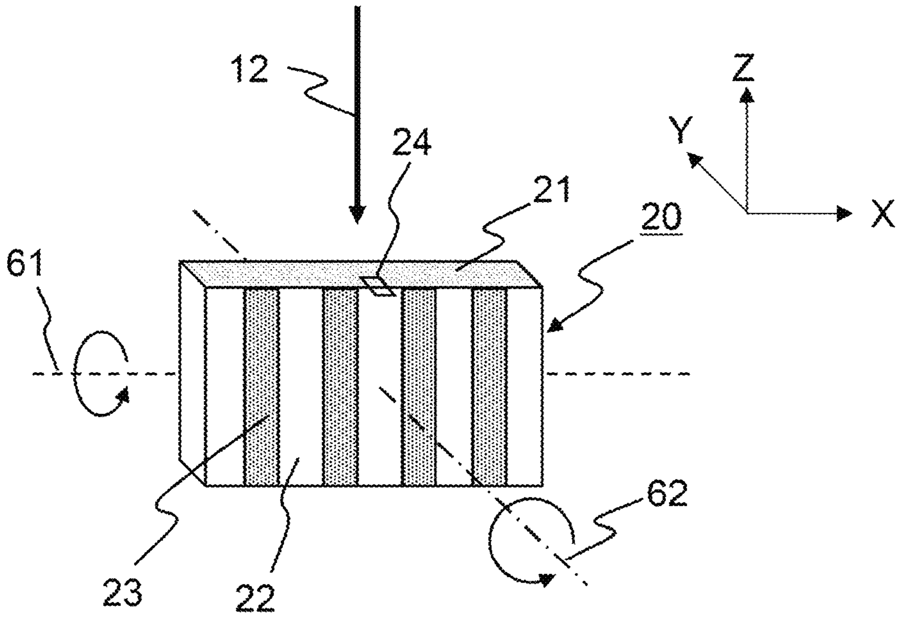
[FIG. 2B]
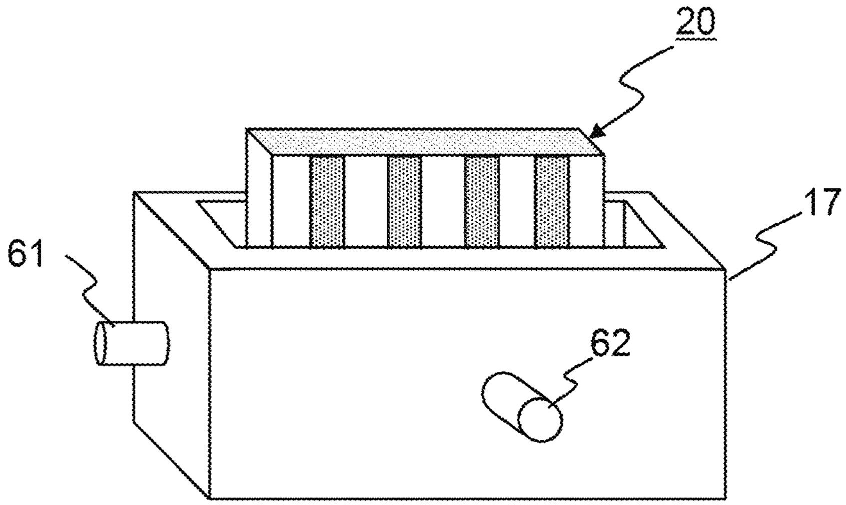

[FIG. 3]
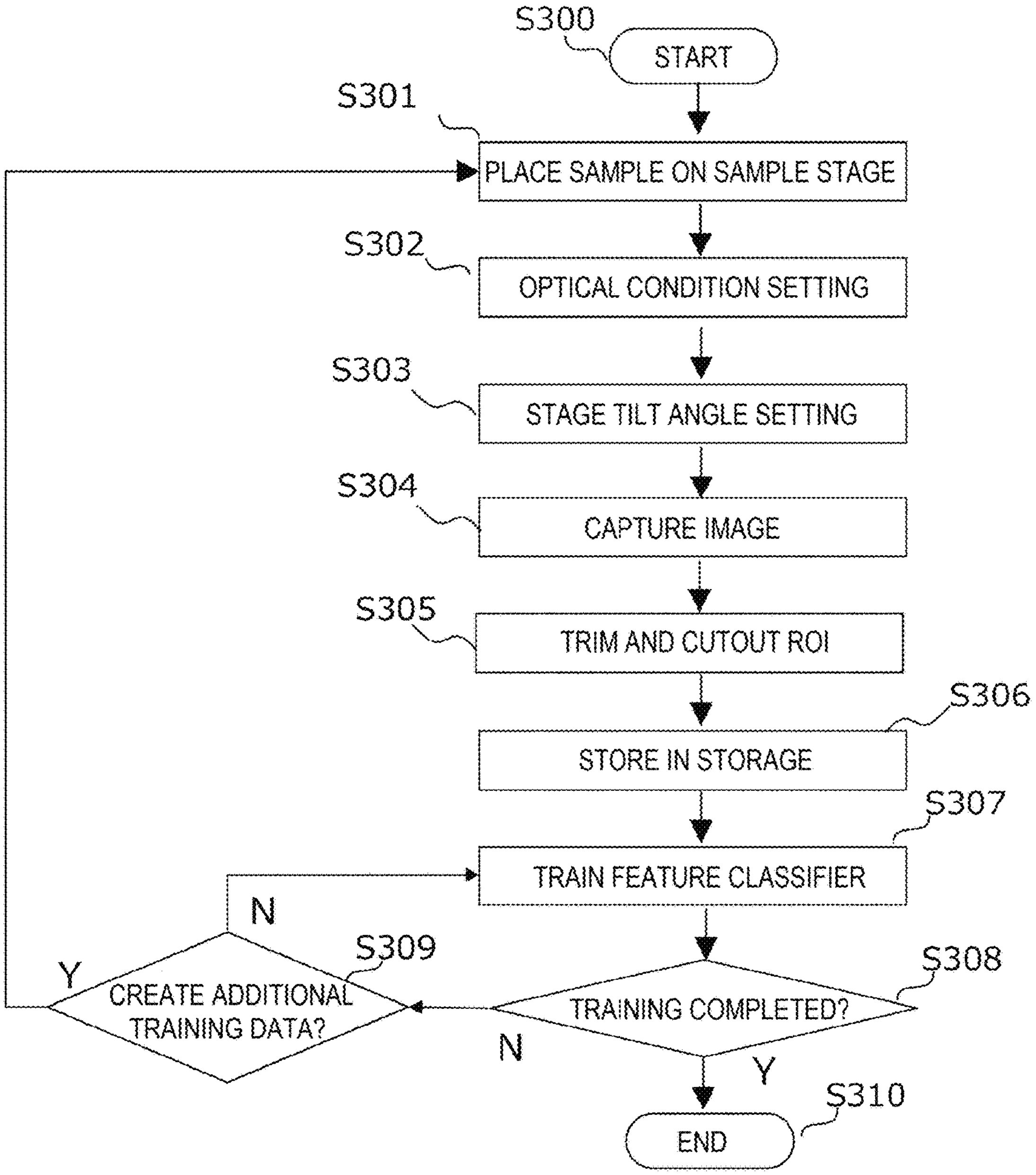

[FIG. 4A]
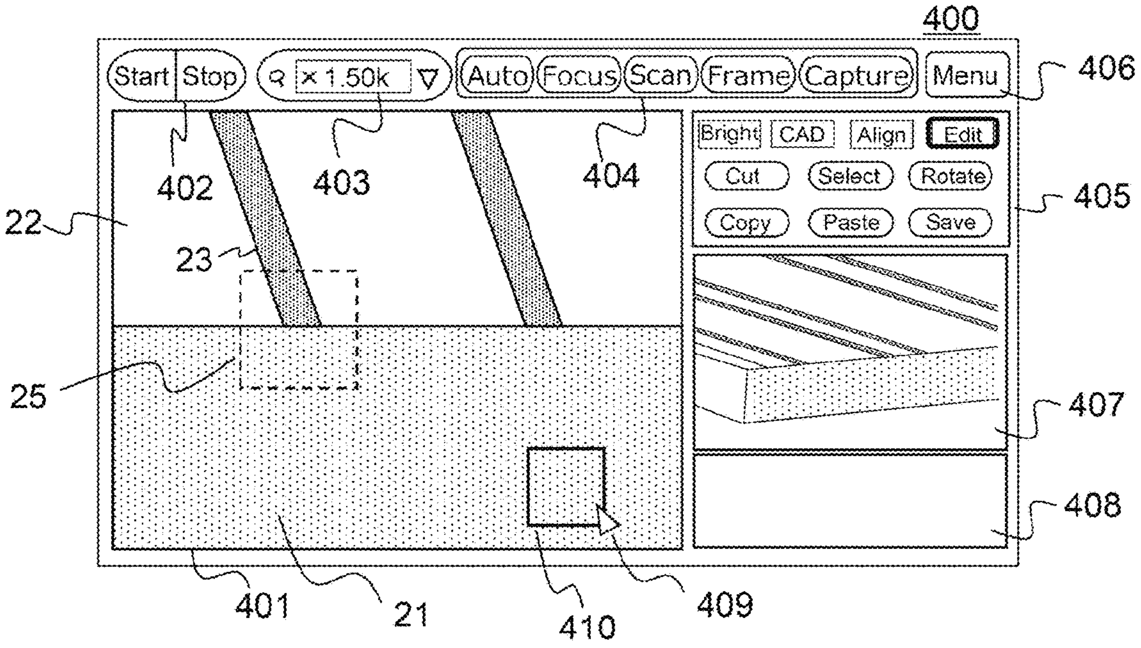

[FIG. 4B]
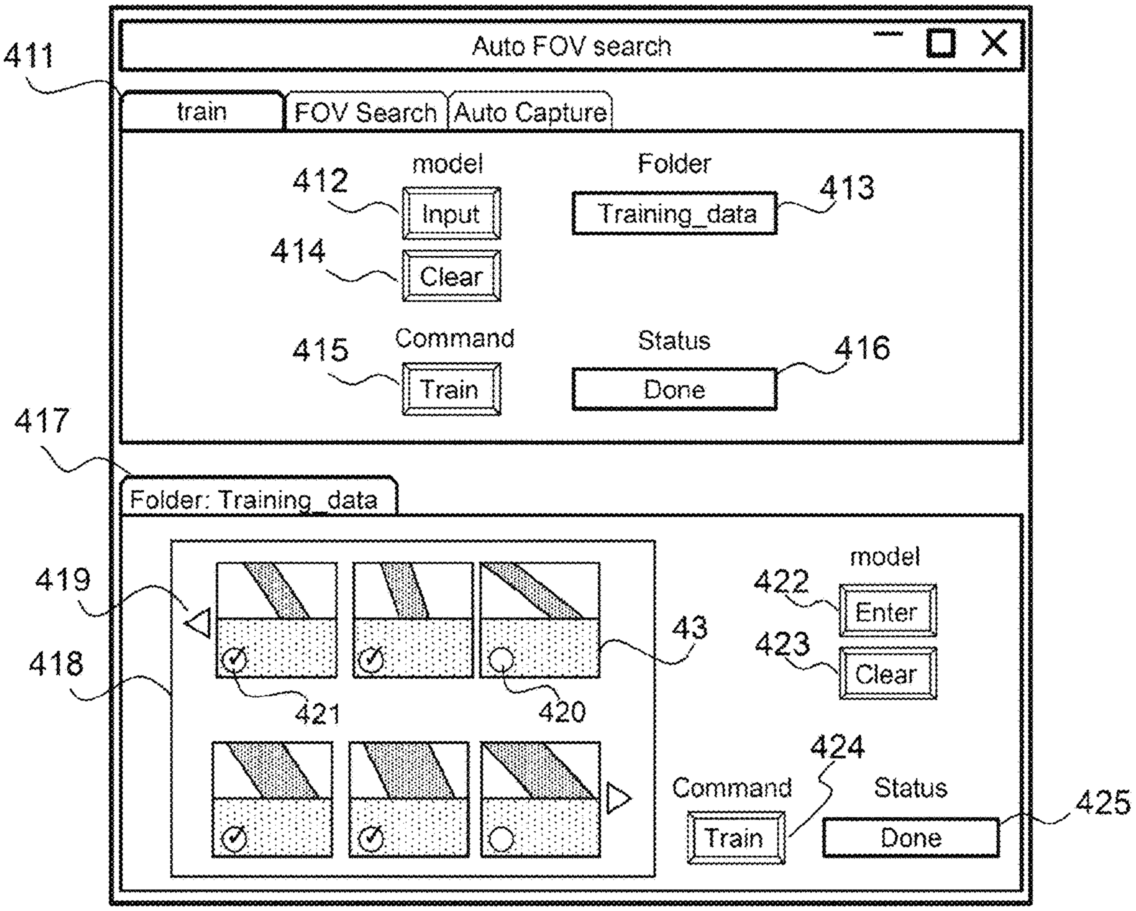

[FIG. 5A]
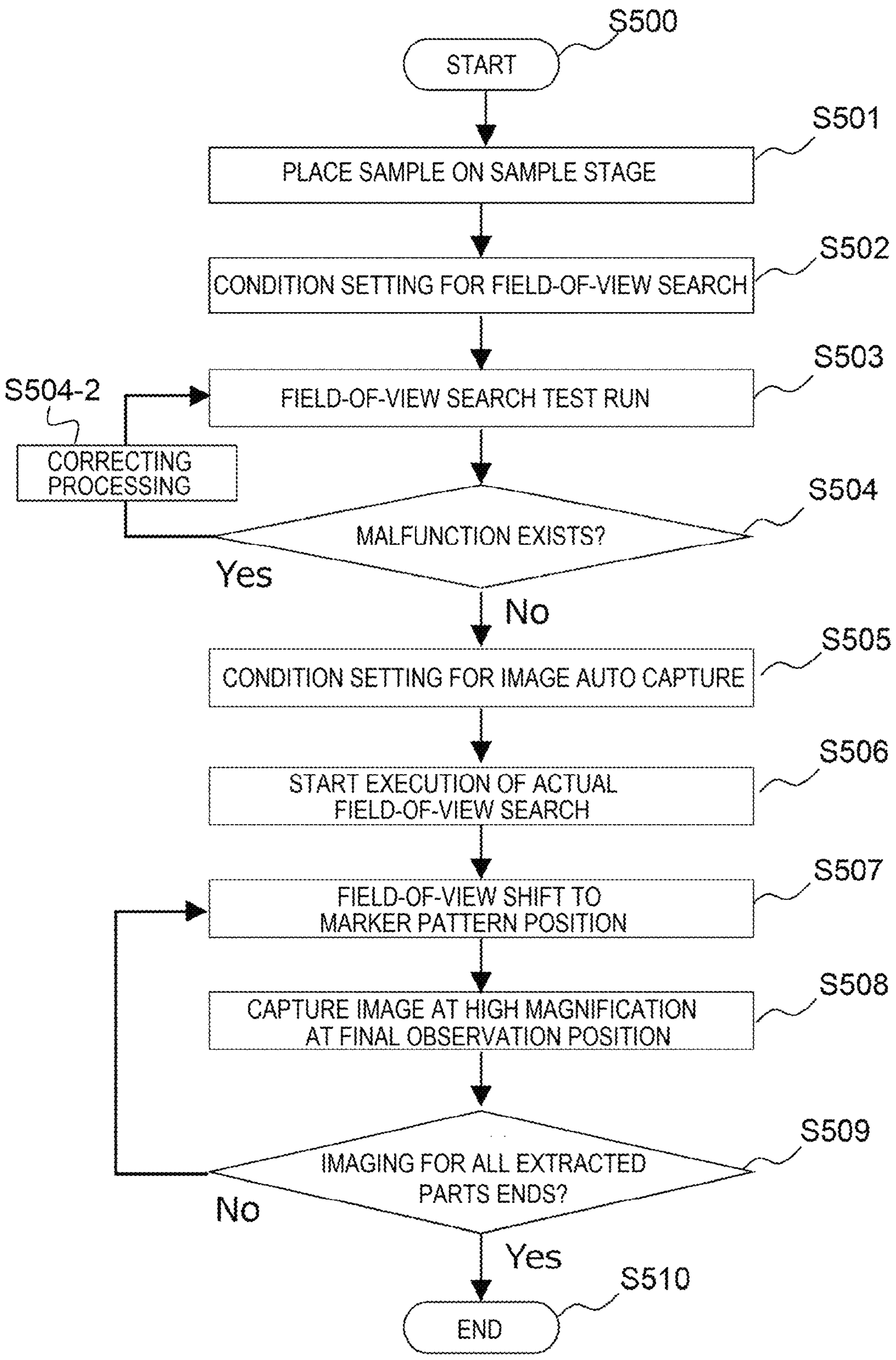

[FIG. 5B]
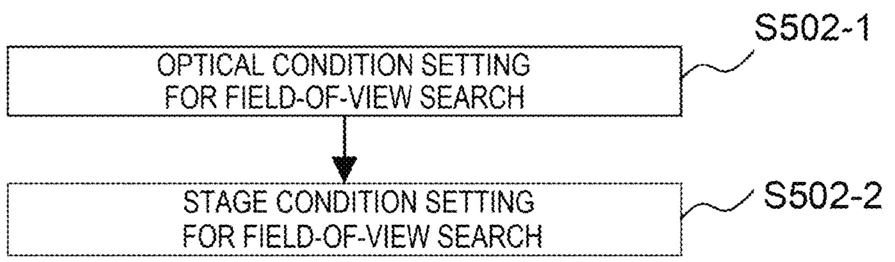
[FIG. 5C]
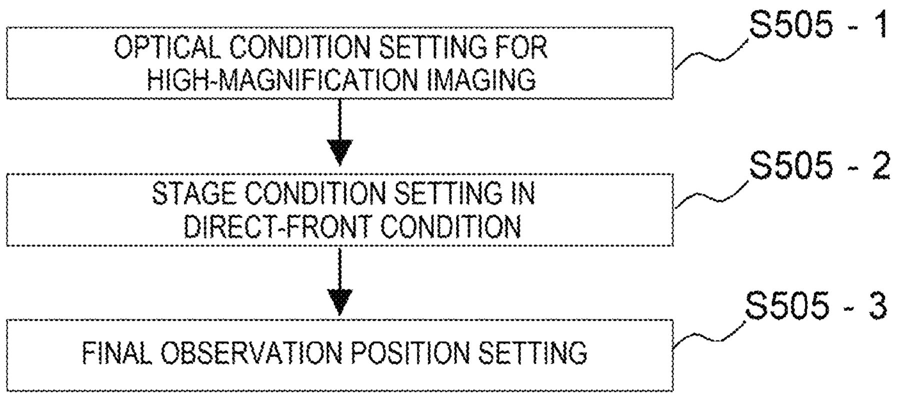

[FIG. 5D]
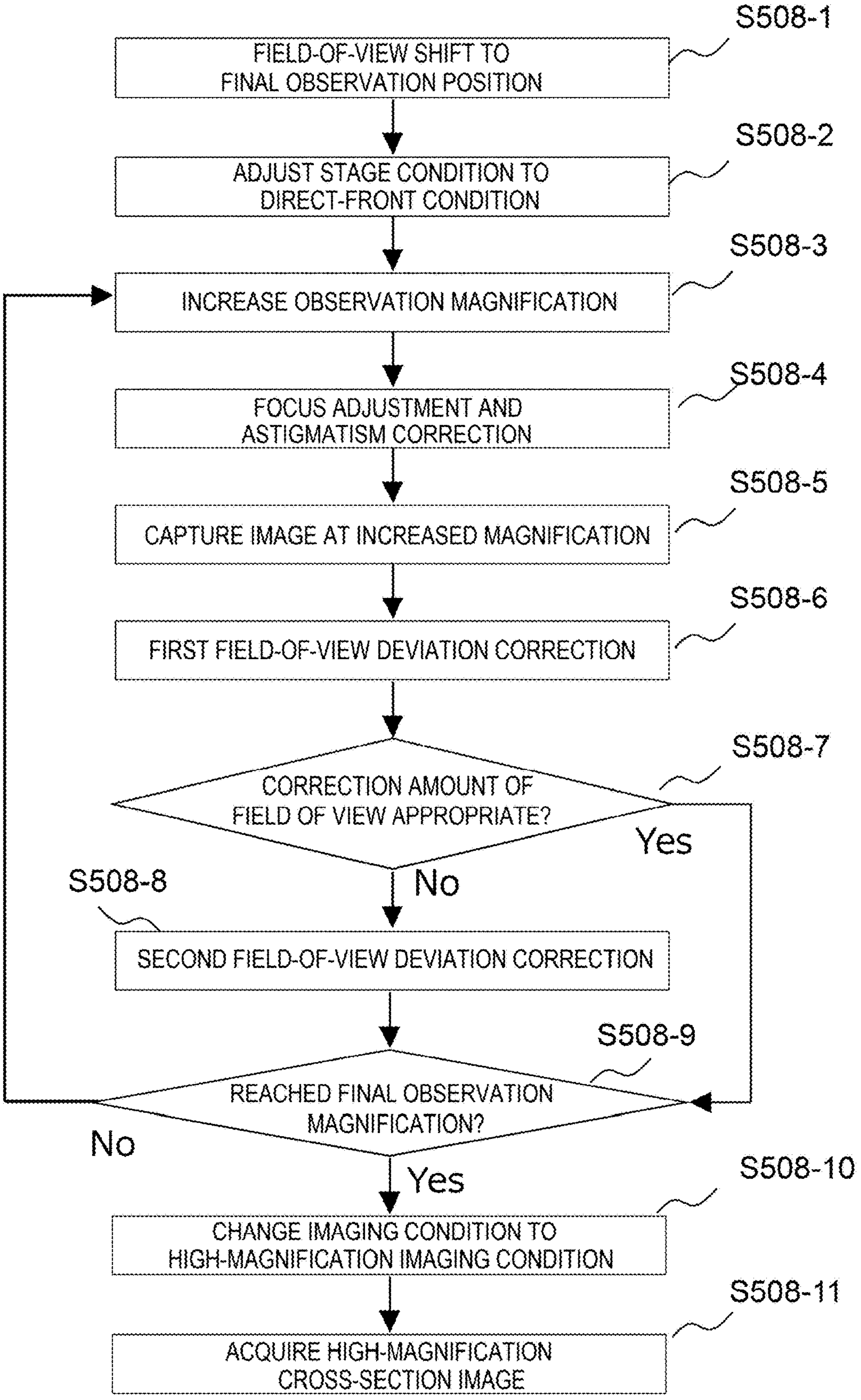

[FIG. 6A]
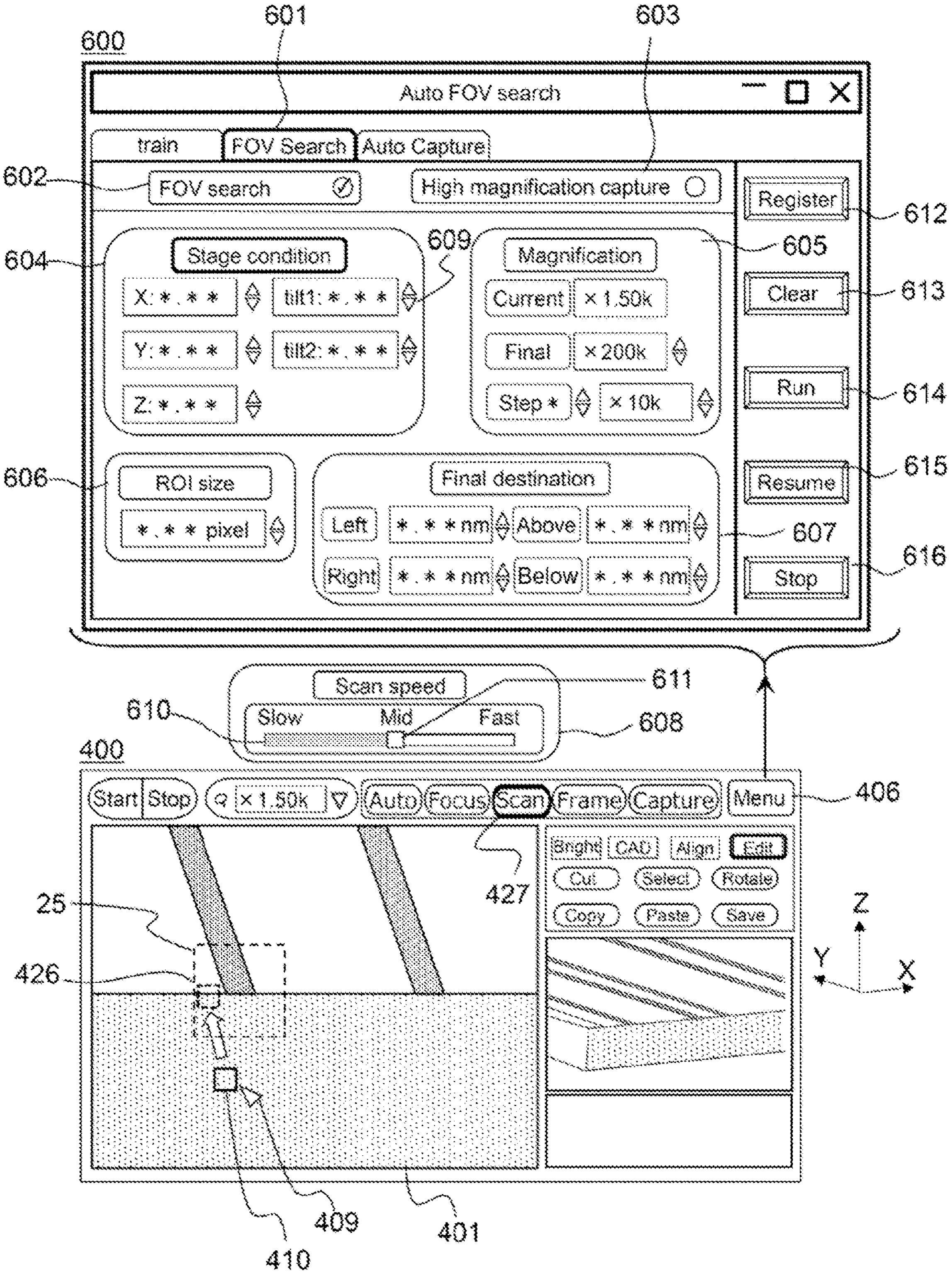

[FIG. 6B]
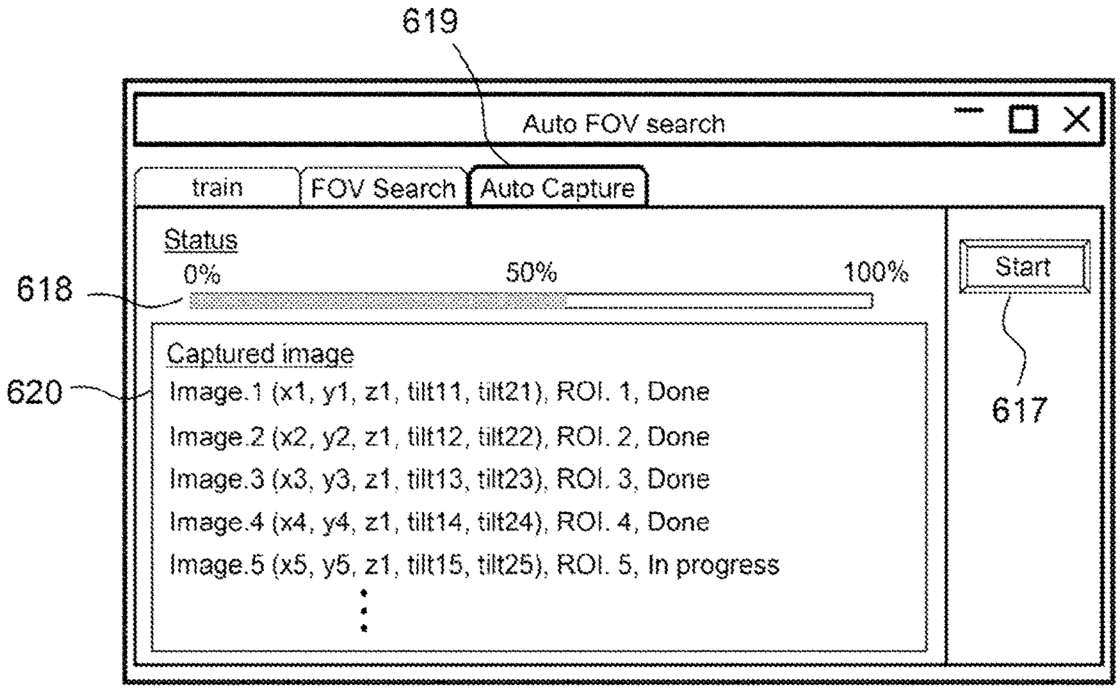
[FIG. 7]
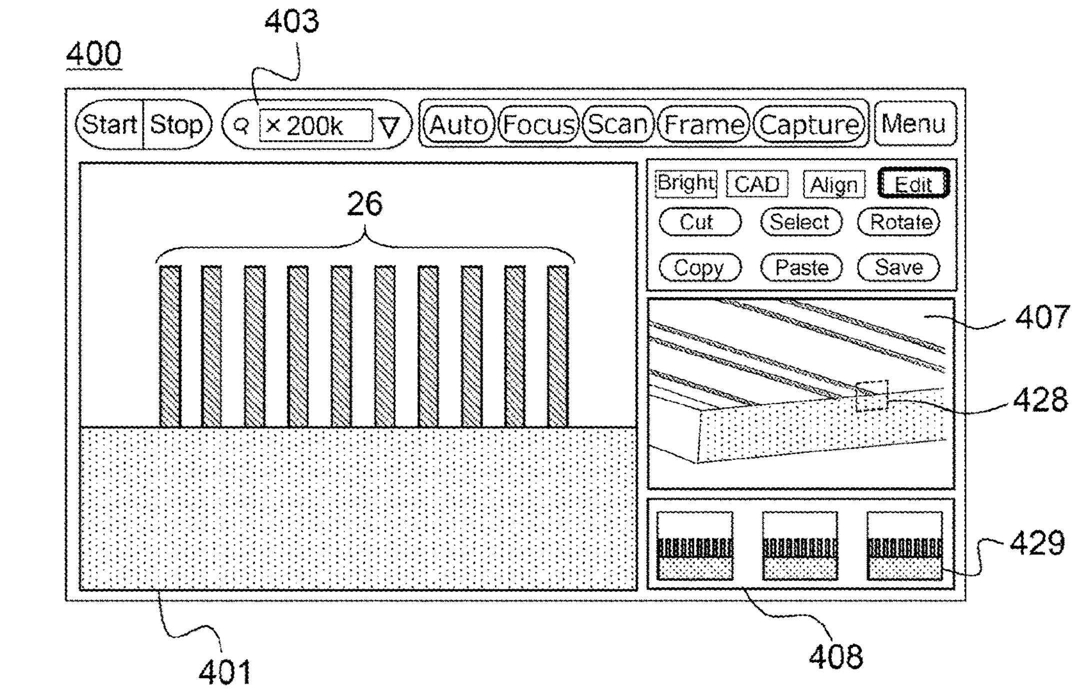

[FIG. 8A]
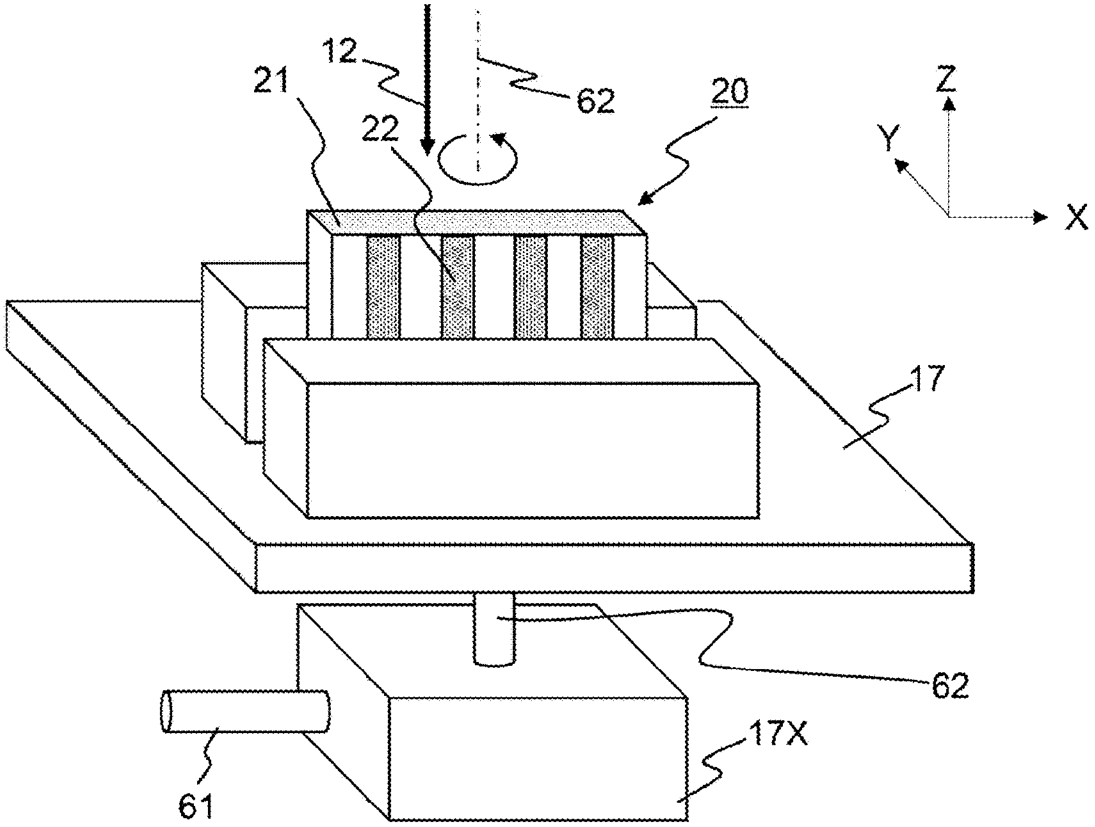

[FIG. 8B]
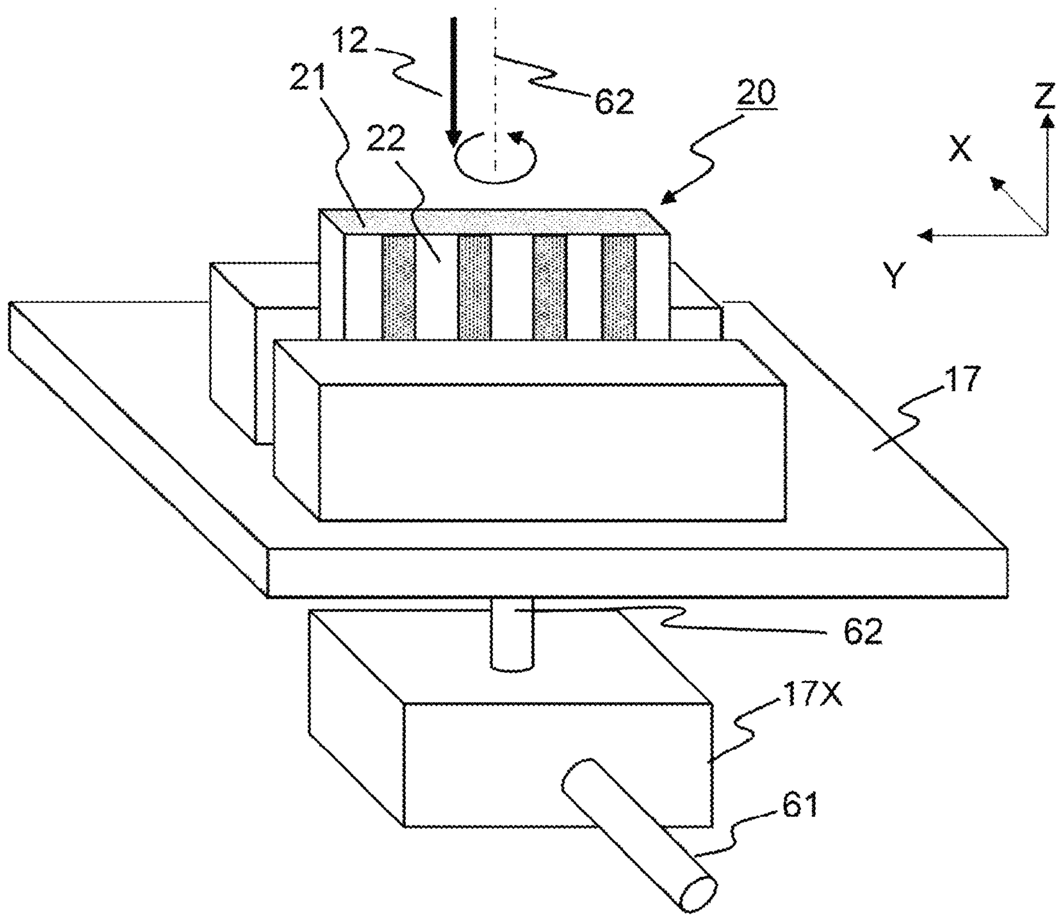

[FIG. 9]
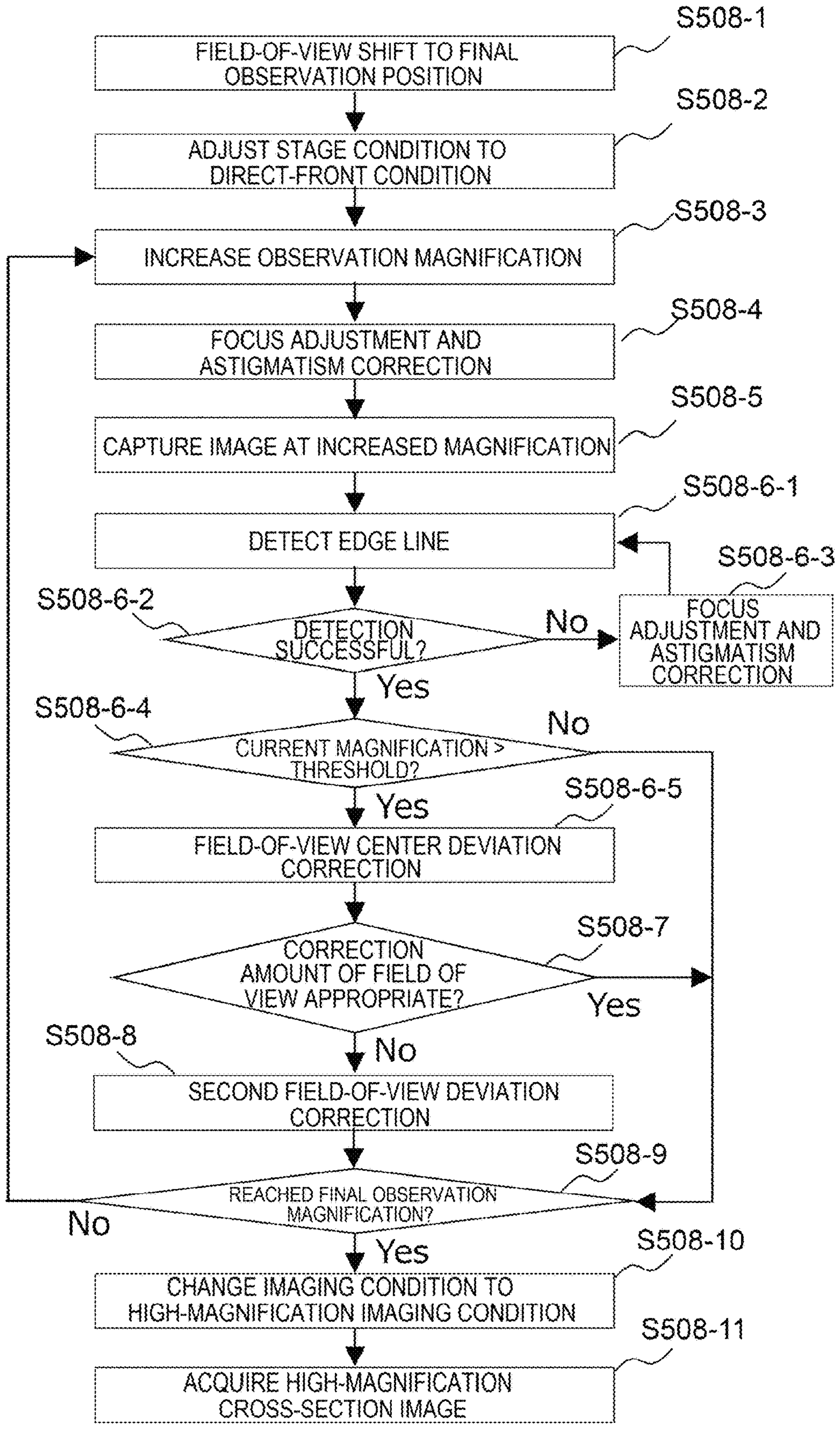

[FIG. 10]
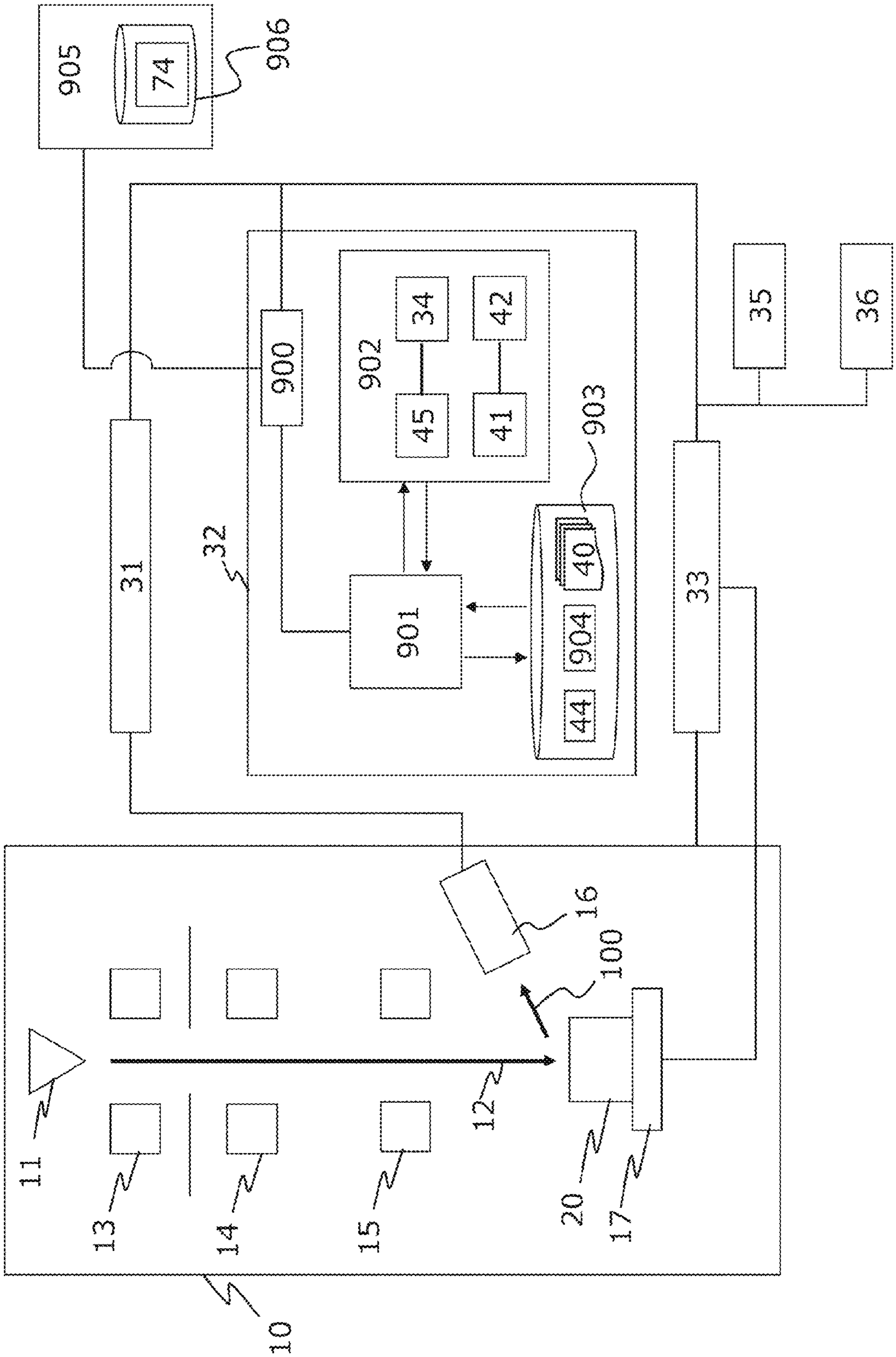

[FIG. 11]
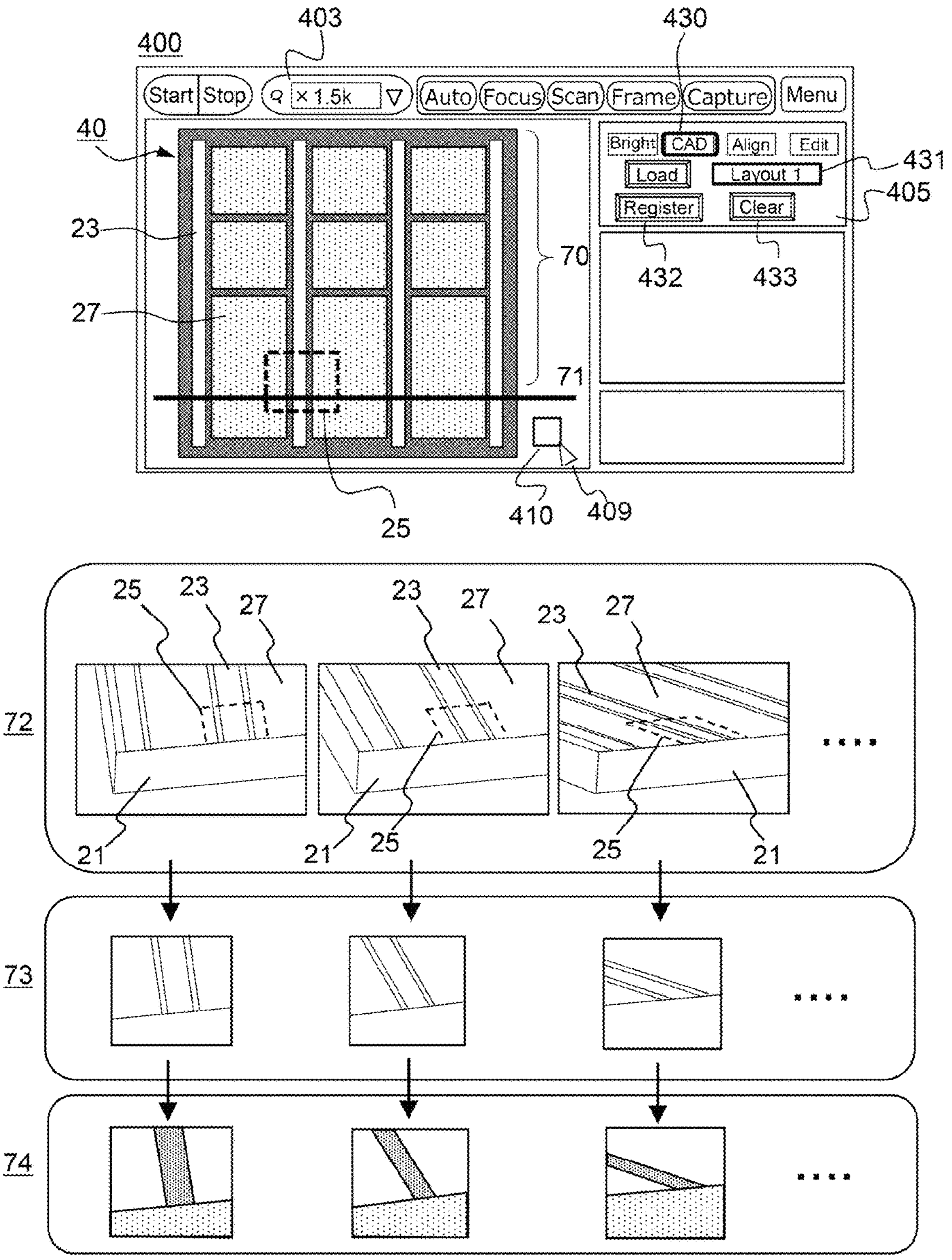

[FIG. 12]
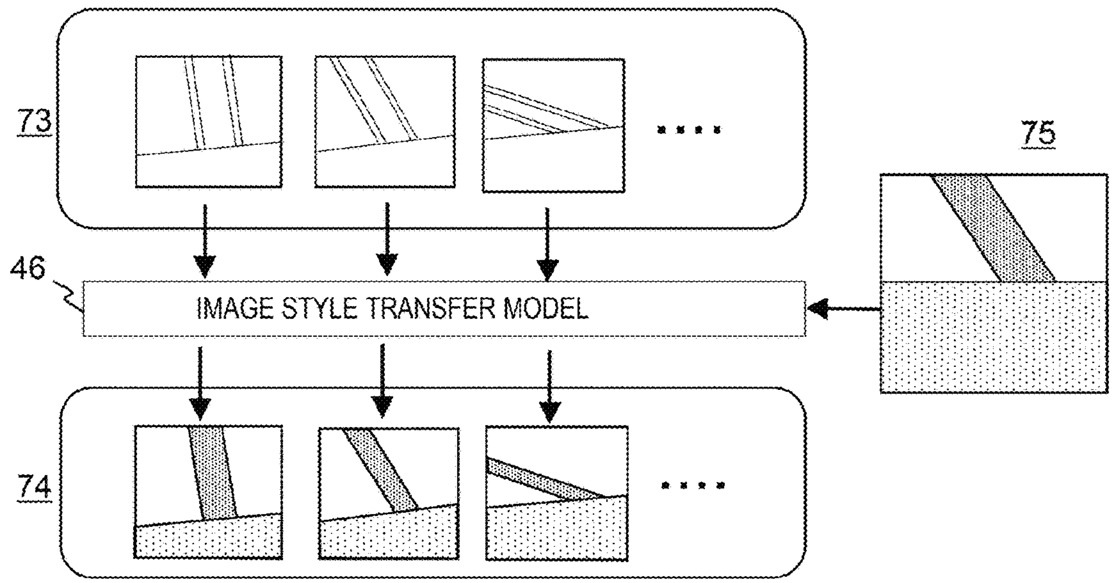
[FIG. 13]
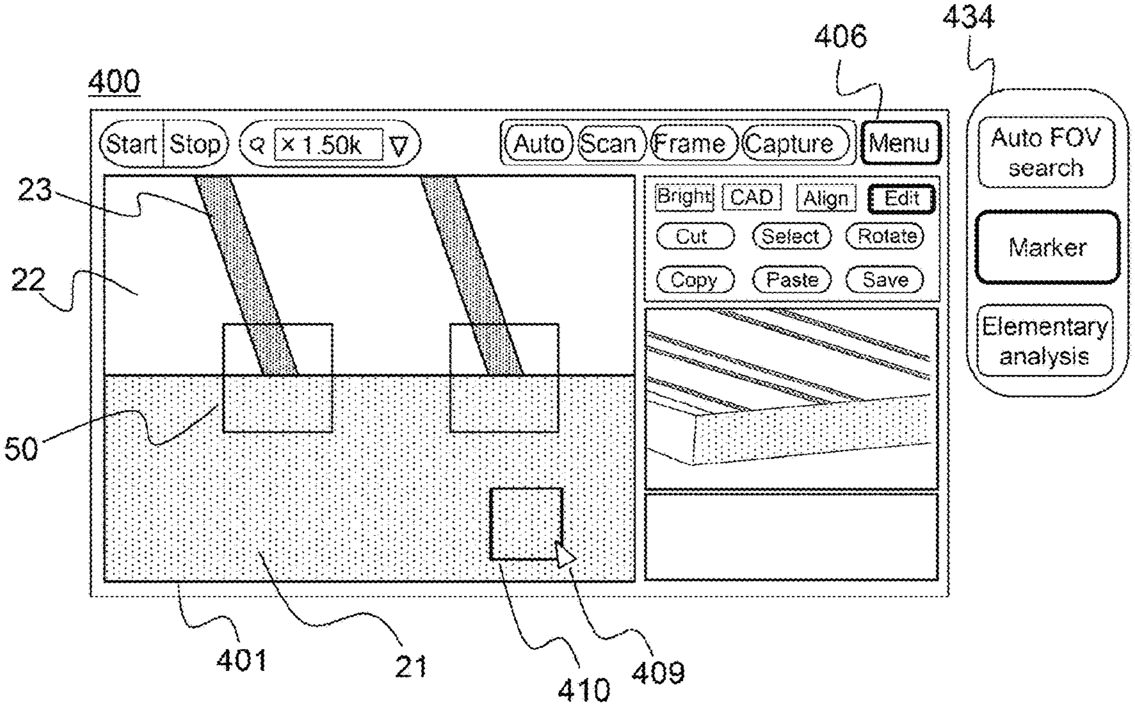

[FIG. 14A]
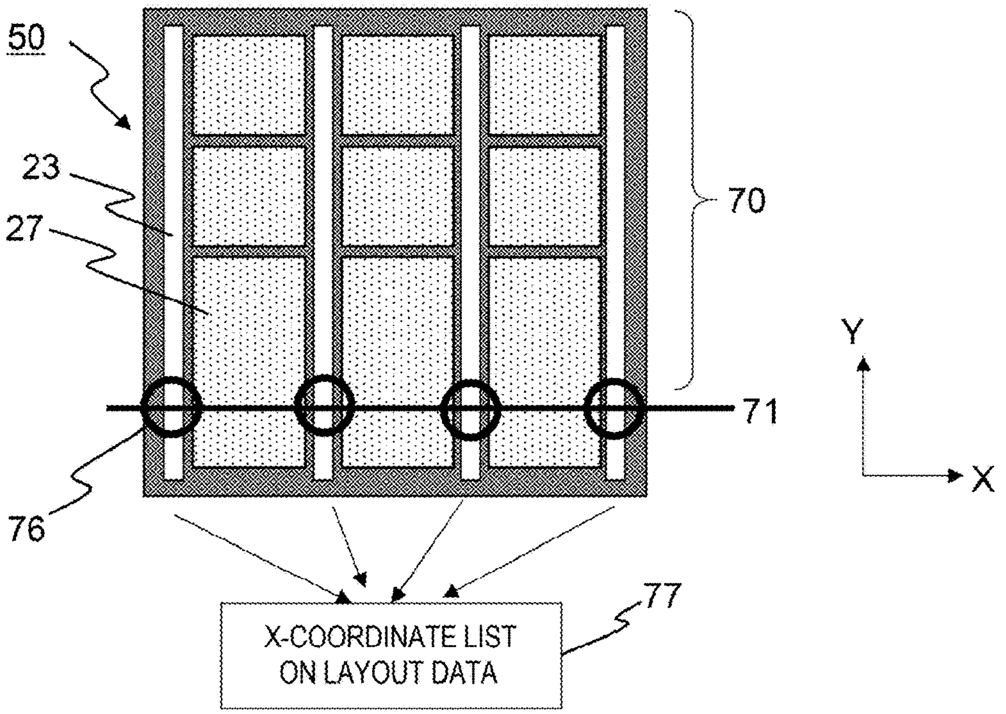
[FIG. 14B]
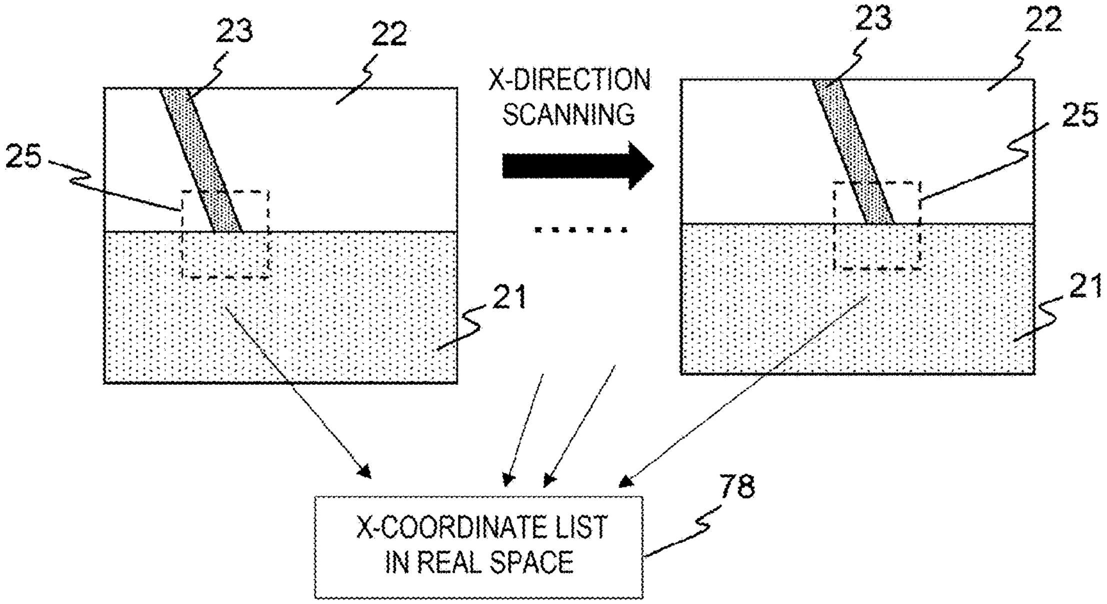

[FIG. 14C]
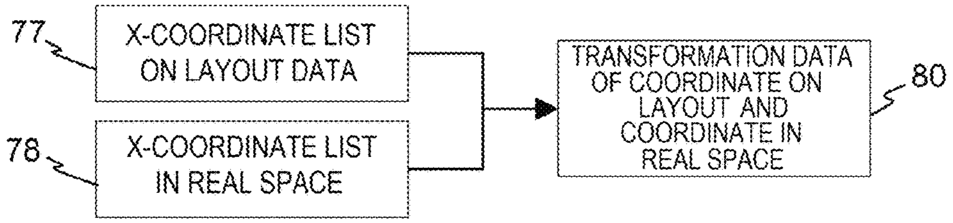
[FIG. 15]
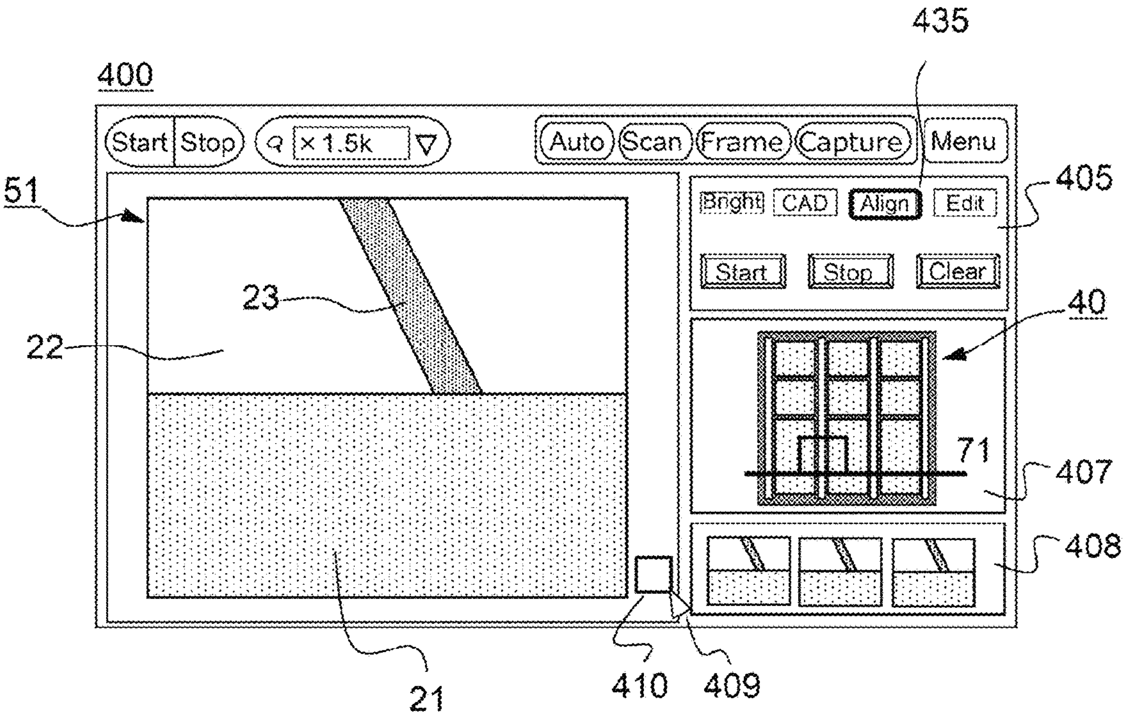

[FIG. 16]
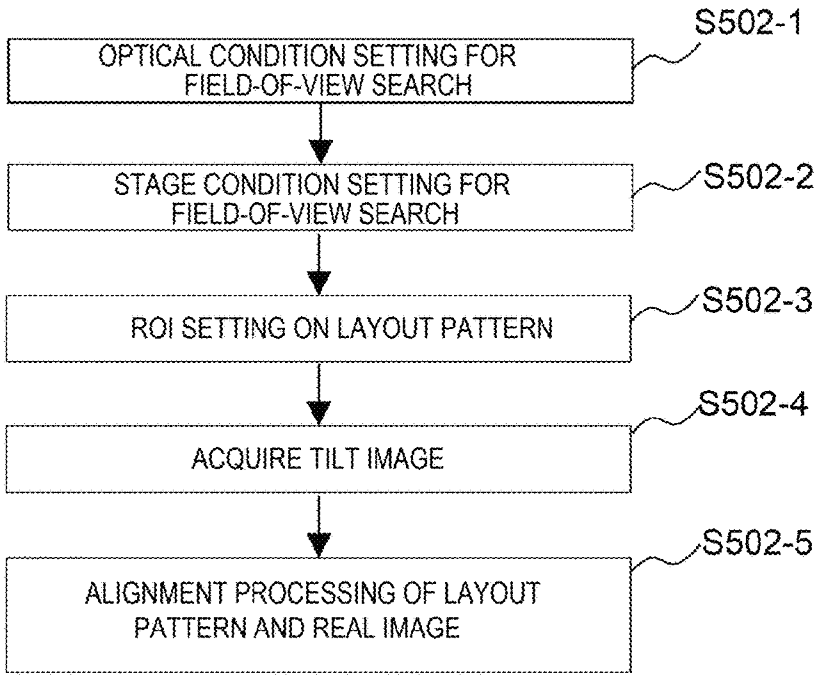
[FIG. 17A]
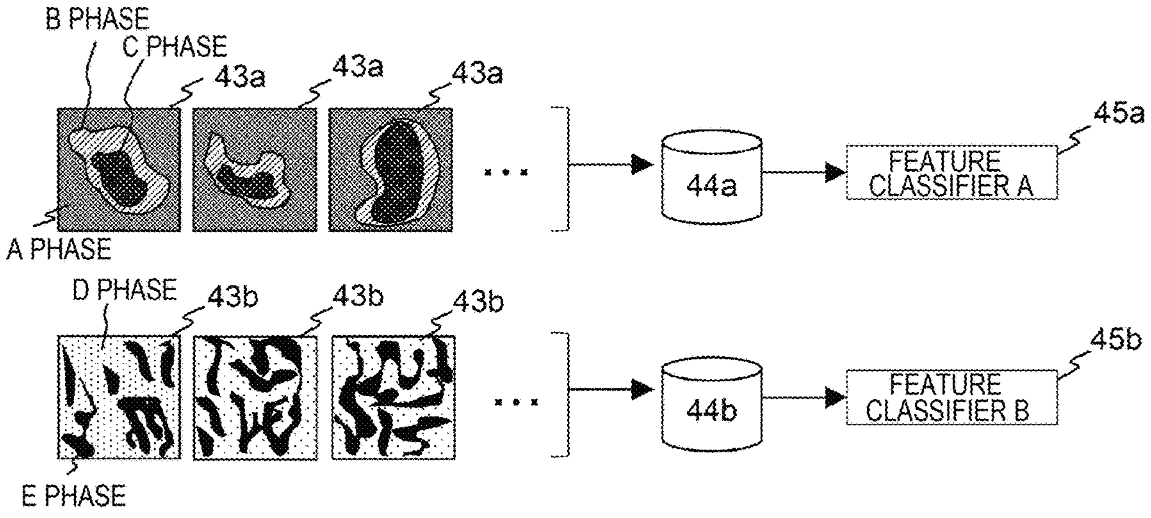

[FIG. 17B]
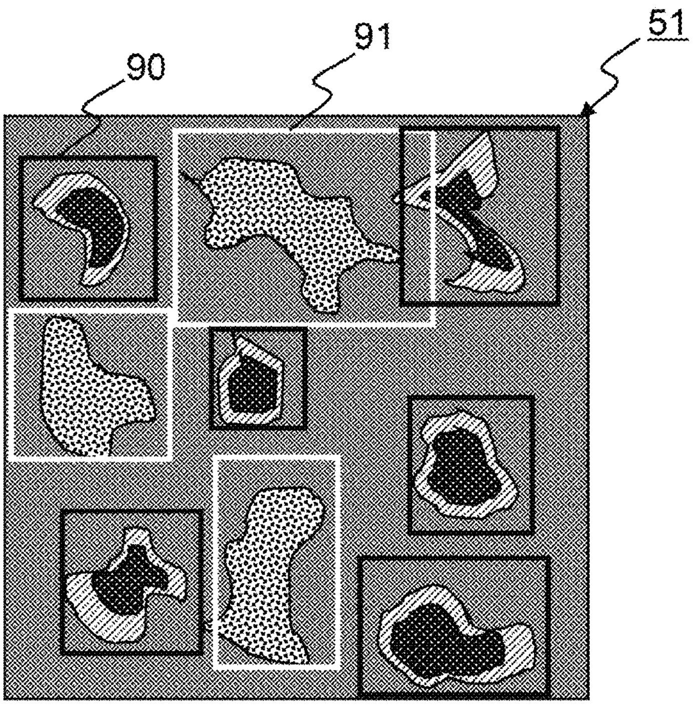
[FIG. 17C]
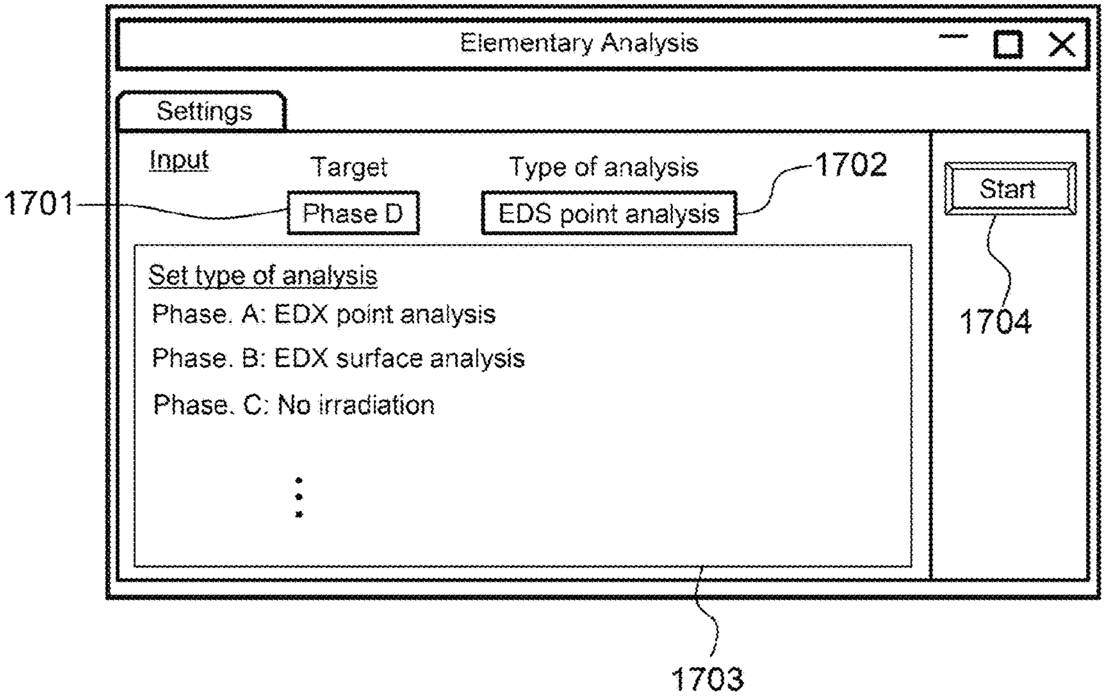

[FIG. 18]
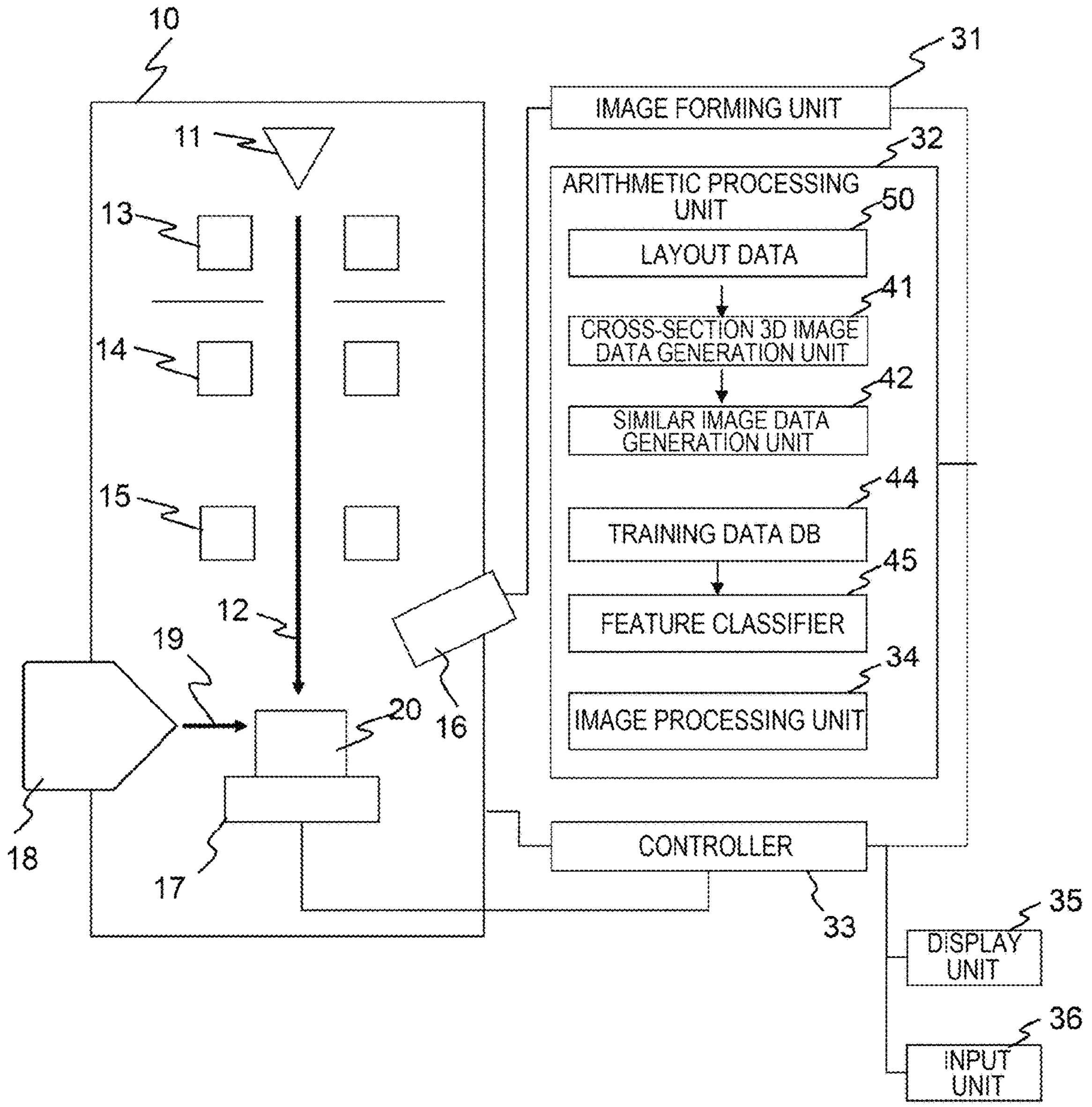

CHARGED PARTICLE BEAM DEVICE

TECHNICAL FIELD

The present invention relates to a charged particle beam apparatus.

BACKGROUND ART

Along with advances in semiconductor devices in recent years, the device structure has been complicated. For semiconductor manufacturers who manufacture advanced devices, how rapidly and efficiently a fabrication-process of such devices can be developed is an important issue. In the semiconductor fabrication-process development, it is essential to optimize conditions for processing a material deposited and laminated on a silicon (Si) wafer to have a shape as designed, and thus pattern-processed shape observation of a cross section is necessary.

Since a processed pattern of an advanced semiconductor device has a fine structure at a nanometer level, a charged particle beam apparatus such as a transmission electron microscope (TEM), and a scanning electron microscope (SEM) with a high resolution are used for the pattern-processed shape observation of the cross section.

In the current situation, the processed shape observation of the wafer cross section by using the charged particle beam apparatus is left to operation by humans, and requires a lot of time and effort for observation-field-of-view search and imaging operation. Therefore, for the sake of enhancing the speed and efficiency of the semiconductor fabrication-process development, an apparatus is demanded, which automates the observation operation as much as possible, and acquires a large amount of observation data in a rapid and personnel saving manner.

Furthermore, also regarding observation target objects other than semiconductors, such as metallic materials and biological samples, demand for an apparatus which can acquire a large amount of observation data in a rapid and personnel saving manner has been increased because of advance in materials informatics technology, etc.

In terms of the above issue, for example, PTL 1 discloses a method of automatically correcting a position of an observation field of view in SEM observation by using a pattern matching technique. This method reduces a work load when an operator adjusts the field of view to an observation target position. However, in this disclosure, only detecting a target pattern in a state in which a substrate is seen from an upper surface side (top view) is considered.

In observation using a charged particle beam apparatus, in order to grasp an observation position, a shape or a structure which exists on a sample and serves as a marker is found, and shifting to the field of view for observation is carried out with reference to the mark. However, when the target observation part is a sample cross section, positional relation between a final observation part and the marker is difficult to be grasped based on the top-view image. Therefore, in the method disclosed in PTL 1, a situation may occur, in which a pattern which serves as the marker cannot be detected, or the observation field of view is set to a wrong position. Furthermore, since it takes time to visually search for the field of view, the demand to acquire a large amount of observation data in a rapid and personnel saving manner cannot be satisfied.

CITATION LIST

Patent Literature

PTL 1: JP2011-129458A

SUMMARY OF INVENTION

Technical Problem

An object of the present disclosure is to provide a charged particle beam apparatus having a function to automatically recognize a marker pattern in observation of a sample cross section utilizing the charged particle beam apparatus.

Solution to Problem

In field-of-view search of a charged particle beam image, in many cases, a marker can more easily be found in a “tilt image” where a sample is observed in an inclined state such that both of an upper surface and a cross section of the sample can be seen, when compared to an observation image (direct-front image) in which the sample cross section is directly facing to a charged particle beam. For example, in a case in which an observed sample is a semiconductor wafer where a pattern is formed, or a cut coupon of the semiconductor wafer, etc., assuming that directions within a surface of the sample are X and Y directions, and a thickness direction of the sample is a Z direction, a pattern scale in the X and Y directions is much larger than a processed pattern scale in the Z direction. Therefore, a possibility that a large-scale shape or structure exists is high, and a marker with high visibility can easily be found even in a low-magnification image. Thus, in the field-of-view search of the observation part in the low-magnification image, it is considered that use of a tilt image but not a top-view image makes identifying of the field of view easier when compared to the conventional technique.

An exemplary charged particle beam apparatus of the disclosure automatically recognizes a marker which serves as a reference for an observation position by a machine leaning model or a template matching using a tilt image, shifts a field of view to a given observation position with reference to the marker, and performs cross-section observation. The machine learning model is generated based on an actual observation image, or based on a three-dimensional model generated from two-dimensional layout data such as design data, and including a cross section. In detail, an exemplary charged particle beam apparatus of the disclosure includes an imaging device which acquires image data of a sample at a given magnification by radiating a charged particle beam to the sample, a computer system which executes arithmetic processing for field-of-view search at the time of acquisition of the image data, by using the image data, and a display unit on which a graphical user interface (GUI) to input a setting parameter for the field-of-view search is displayed. The imaging device is provided with a sample stage configured to be capable of transferring the sample by at least two drive shafts, and shifting an imaging field of view corresponding to positional information of the sample, the positional information being obtained by the computer system. The computer system includes a classifier which outputs, in response to input of image data of a tilt image where the sample is imaged in an inclined state with respect to the charged particle beam, positional information of one or more feature parts existing on the tilt image. The classifier is trained in advance by using training data in which input is image data of the tilt image, and output is positional information of the feature part. The computer system executes, with respect to new tilt image data inputted into the classifier, a processing to output positional information of the feature part.

Advantageous Effects of Invention

According to the embodiments of the present disclosure, the charged particle beam apparatus capable of largely reducing time and effort required for the field-of-view search in observation of the sample cross section, and of automatic capturing of the cross-section image, can be achieved.

BRIEF DESCRIPTION OF DRAWINGS

FIG. 1 is a configuration diagram of a charged particle beam apparatus according to a first embodiment.

FIG. 2A is a schematic view illustrating a relative positional relation between a sample 20 and a tilt shaft according to the first embodiment.

FIG. 2B is a schematic view illustrating a sample stage 17 according to the first embodiment.

FIG. 3 is a chart presenting a training procedure of a feature classifier 45 according to the first embodiment.

FIG. 4A is a schematic view illustrating a main GUI provided to the charged particle beam apparatus according to the first embodiment.

FIG. 4B is a view illustrating a GUI used at a time of building of the feature classifier 45.

FIG. 5A is a flowchart presenting an automatic capturing sequence according to the first embodiment.

FIG. 5B is a flowchart presenting details of Step S502 in FIG. 5A.

FIG. 5C is a flowchart presenting details of Step S505 in FIG. 5A.

FIG. 5D is a flowchart presenting details of Step S508 in FIG. 5A.

FIG. 6A is a view illustrating a GUI used at a time of field-of-view search and a main GUI displayed at the same time.

FIG. 6B is a view illustrating a GUI for instructing execution of the automatic capturing sequence.

FIG. 7 is a schematic view illustrating an observation result of a sample cross section at a high magnification.

FIG. 8A is a schematic view illustrating operation of the sample stage 17 of a charged particle beam apparatus according to a second embodiment.

FIG. 8B is a schematic view illustrating the sample stage 17 in FIG. 8A while being rotated by 90° about a Z axis.

FIG. 9 is a flowchart presenting an automatic capturing sequence according to a third embodiment.

FIG. 10 is a configuration diagram of a charged particle beam apparatus according to a fourth embodiment.

FIG. 11 is a conceptual diagram presenting a GUI used for building of the feature classifier 45 and a processing executed during the building process according to the fourth embodiment.

FIG. 12 is a conceptual diagram presenting a process of generating training data according to the fourth embodiment.

FIG. 13 is a schematic view illustrating a GUI screen according to a sixth embodiment.

FIG. 14A is an operation explanatory diagram of layout data according to a seventh embodiment.

FIG. 14B is a conceptual diagram presenting operation to acquire a real image used in coordinate matching according to the seventh embodiment.

FIG. 14C is a conceptual diagram presenting the coordinate matching according to the seventh embodiment.

FIG. 15 is one example of a GUI screen showing an effect according to the seventh embodiment.

FIG. 16 is a flowchart presenting a field-of-view search sequence to which the coordinate matching according to the seventh embodiment is applied.

FIG. 17A is a conceptual diagram presenting a building method of a feature classifier according to an eighth embodiment.

FIG. 17B is a schematic view illustrating a field-of-view search result according to the eighth embodiment.

FIG. 17C is a schematic view illustrating a GUI provided to a charged particle beam apparatus according to the eighth embodiment.

FIG. 18 is a configuration diagram of a charged particle beam apparatus according to a ninth embodiment.

DESCRIPTION OF EMBODIMENTS

Hereinafter, embodiments of the present disclosure are described in detail in the respective embodiments. However, disclosed contents of the respective embodiments are not limited to the described examples, but configurations in which the disclosure in the respective embodiments and elemental technologies suggested therein are suitably combined within a knowledge of the person skilled in the art, are also included in the scope of the embodiments.

First Embodiment

A first embodiment realizes, in a charged particle beam apparatus in which a scanning electron microscope (SEM) is an imaging device, a function to automatically recognize a field of view for an observation target object, and proposes a method for automatic observation of a sample by using the function.

FIG. 1 illustrates a configuration diagram of the scanning electron microscope according to the first embodiment. As one example, a scanning electron microscope 10 of the first embodiment includes an electron gun 11, a condenser lens 13, deflection coils 14, an objective lens 15, a secondary electron detector 16, a sample stage 17, an image forming unit 31, a controller 33, a display unit 35, and an input unit 36. Furthermore, the scanning electron microscope 10 is provided with a computer system 32 which executes arithmetic processing necessary for a field-of-view search function of this embodiment. Below, each component is described.

The electron gun 11 includes a radiation source which emits an electron beam 12 accelerated at a given acceleration voltage. The emitted electron beam 12 is concentrated by the condenser lens 13 and the objective lens 15, and is radiated on a sample 20. The deflection coils 14 deflect the electron beam 12 by a magnetic field or an electric field, and thus a surface of the sample 20 is scanned by the electron beam 12.

The sample stage 17 has a function to transfer the sample 20 along a given drive shaft, or incline or rotate the sample 20 about a given drive shaft in order to shift an imaging field of view of the imaging device 10, and is provided with an actuator, such as a motor and a piezoelectric element, for such function.

The secondary electron detector 16 is an E-T detector, which includes a scintillator, a light guide, and a photomultiplier tube, a semiconductor detector, or the like, and detects a secondary electron 100 emitted from the sample 20 irradiated with the electron beam 12. A detection signal outputted from the secondary electron detector 16 is transmitted to the image forming unit 31. Note that, along with the secondary electron detector 16, a backscattered electron detector which detects a backscattered electron, and a transmission electron detector which detects a transmission electron may be provided.

The image forming unit 31 includes an AD converter which converts, into a digital signal, the detection signal transmitted from the secondary electron detector 16, an arithmetic unit which forms an observation image of the sample 20 based on the digital signal outputted from the AD converter, and the like (none of them are illustrated). As the arithmetic unit, for example, an MPU (Micro Processing Unit), a GPU (Graphic Processing Unit), and the like, are used. The observation image formed by the image forming unit 31 is sent to the display unit 35 to be displayed thereon, and to the computer system 32 to be applied with various processing.

The computer system 32 includes an interface 900 which inputs and outputs data and command from and to an external device, a processor or a CPU (Central Processing Unit) 901 which executes various arithmetic processing to provided information, a memory 902, and a storage 903.

The storage 903 includes, for example, an HDD (Hard Disk Drive), an SSD (Solid State Drive), and the like, and stores software 904 which constitutes a field-of-view search tool according to this embodiment, and a training data DB (data base) 44. The software (field-of-view search tool) 904 of this embodiment may include as functional blocks, for example, a feature classifier 45 which extracts, from inputted image data, a marker pattern 23 for the field-of-view search, and an image processing unit 34 which calculates, from a position of the detected marker pattern on the image, position coordinates of the marker pattern 23 with reference to positional information of the sample stage 17.

The memory 902 illustrated in FIG. 1 presents a state where the respective functional blocks which constitute the software 904 are developed in the memory space. During execution of the software 904, the CPU 901 executes the respective functional blocks developed in the memory space.

The feature classifier 45 is a program implemented with a machine learning model, and is trained by using image data of the marker pattern 23 stored in the training data DB 44 as training data. When new image data is inputted into the trained feature classifier 45, a position of the marker pattern learned in the image data is extracted, and center coordinates of the marker pattern in the new image data is outputted. The outputted center coordinates are used for identification of an ROI (Region Of Interest) at the time of the field-of-view search, and also various positional information calculated based on the center coordinates is transmitted to the controller 33 to be used for drive control of the sample stage 17.

The image processing unit 34 executes processing such as edge-line detection of a wafer surface based on image processing, and calculation and evaluation of image sharpness when focus adjustment, astigmatism correction, and the like, are automatically executed in a cross-section image in which a sample cross section is directly facing to the field of view.

The controller 33 is an arithmetic unit which controls the respective units, and processes and transmits data generated by the respective units. The controller 33 is, for example, a CPU, an MPU, or the like. The input unit 36 is a device to input an observation condition for observation of the sample 20, and to input a command for execution, stop, etc., of the observation. The input unit 36 may be configured by, for example, a keyboard, a mouse, a touch panel, a liquid crystal display, or a combination thereof. The display unit 35 displays a GUI (Graphical User Interface) which constitutes an operation screen for an operator, and a captured image.

Next, with reference to FIG. 2A, a relative positional relation between the sample 20 as the observation target object, and the drive shaft of the sample stage 17 is described. FIG. 2A is a perspective view of a wafer sample which is one example of the observation target object of the charged particle beam apparatus of this embodiment.

In FIG. 2A, the sample 20 is a coupon sample obtained by a wafer being cut, and has a cut surface 21, and an upper surface 22 where a processed pattern is formed. The sample 20 is produced through manufacturing processes and fabrication-process developing processes of a semiconductor device, and a fine structure is formed on the cut surface 21. In many cases, an imaging part intended by an operator of the charged particle beam apparatus exists on the cut surface 21.

On the upper surface 22, a shape and a structure larger than the size of the above-mentioned fine structure (that is, the marker pattern 23 which can be used as a marker during the field-of-view search) is formed. As the marker pattern 23, for example, a characteristic shape marker for identification of a chip processing region on the wafer, a processed pattern including a label information, and the like, may be used.

Orthogonal axes XYZ illustrated at an upper right in FIG. 2A are coordinate axes indicating the relative positional relation of the sample 20 with respect to the electron beam 12. A traveling direction of the electron beam 12 is the Z axis, a direction parallel to a first tilt shaft 61 of the sample stage 17 is the X axis, and a direction parallel to a second tilt shaft 62 is the Y axis. In this embodiment, the sample 20 is placed on the sample stage 17 such that a longitudinal direction of the sample 20 is in parallel to the X axis.

When the fine shape on the cut surface 21 is observed, the electron beam 12 is radiated substantially vertically to the cut surface 21, and a region of a cross-section-observation field of view 24 is observed. However, in many cases, the cut surface 21 which is cut manually is not fully orthogonal to the upper surface 22, and attachment angles when the operator places the sample 20 on the sample stage 17 are not necessarily the same every time.

Therefore, as an angle adjustment shaft for making the cut surface 21 orthogonal to the electron beam 12, the first tilt shaft 61 and the second tilt shaft 62 are provided to the sample stage 17. The first tilt shaft 61 is a drive shaft for rotating the sample 20 in the Y-Z plane. Since a longitudinal direction of the cut surface 21 is the X-axis direction, a rotational angle of the first tilt shaft 61 is adjusted in a case in which a tilt angle is adjusted when the sample 20 is inclined and observed from an oblique direction (that is, a tilt angle of a tilt image). Similarly, the second tilt shaft 62 is a drive shaft for rotating the sample 20 in the X-Z plane. In the case in which the field of view is at a direct-front position with respect to the cut surface 21, by a rotational angle of the second tilt shaft 62 being adjusted, an image can be rotated centering on an axis in the up-and-down direction passing through the center of the field of view.

A configuration of the sample stage 17 is described with reference to FIG. 2B. As illustrated, the sample 20 is held by and fixed to the sample stage 17. The sample stage 17 is provided with a mechanism to rotate its surface where the sample 20 is placed, about the first tilt shaft 61 or the second tilt shaft 62, and the rotational angle is controlled by the controller 33. Note that although illustration is omitted, the sample stage 17 illustrated in FIG. 2B is also provided with an X-drive shaft, a Y-drive shaft, and a Z-drive shaft to independently move the sample placing surface in the X, Y, and Z directions, respectively, and a rotation shaft to rotate the sample placing surface about the Z-drive shaft. Hence, a scanning region (that is, the field of view) of the electron beam 12 can be shifted in the longitudinal direction, a transverse direction, and a height direction of the sample 20, and also can be rotated. Transfer distances of the X-drive shaft, the Y-drive shaft, and the Z-drive shaft are also controlled by the controller 33.

Next, a training procedure in the feature classifier 45 of this embodiment is described with reference to FIGS. 3, 4A and 4B.

In order for automatic execution of the field-of-view search according to this embodiment, the feature classifier 45 which detects the marker pattern 23 needs to be built in advance before the sample observation. The flowchart in FIG. 3 shows a workflow performed by the operator when the feature classifier 45 is built.

First, the sample 20 is placed on the sample stage 17 in the charged particle beam apparatus illustrated in FIG. 1 (Step S301). Next, an optical condition such as an acceleration voltage and a magnification for capturing an image which serves as training data are set (Step S302). Then, a tilt angle of the sample stage 17 is set (Step S303), and imaging is performed (Step S304). By the execution of Step S304, image data of a tilt image which serves as material for the training data is acquired, and the acquired image data is stored in the storage 903.

FIG. 4A illustrates one example of a main GUI displayed on the display unit 35 of the charged particle beam apparatus of this embodiment, and a tilt image displayed on the main GUI. For example, the main GUI illustrated in FIG. 4A includes a main screen 401, an operation start-and-stop button 402 to instruct start and stop operation of the charged particle beam apparatus, a magnification adjustment field 403 where an observation magnification is displayed and adjusted, a selection panel 404 where item buttons to select a setting item of imaging conditions are displayed, an operation panel 405 to adjust image quality and the stage, a "Menu" button 406 to call up other operation functions, a sub screen 407 where an image of a wider field of view than the main screen 401 is displayed, and an image listing section 408 where the captured image is thumbnail-displayed. The GUI described above is merely example, and a GUI in which an item other than the above items is added, or the item is replaced by another item may be adopted.

The acquired tilt image is displayed on the main screen 401. The tilt image includes the cut surface 21, the upper surface 22, and the marker pattern 23. At Step S302 in FIG. 3, the operator sets the optical condition of the charged particle beam apparatus to a magnification at which the marker pattern 23 is included in the field of view (when there is a plurality of target patterns, set to a magnification at which the plurality of patterns are included). Moreover, at Step S303, the operator sets the tilt angle to an angle at which the marker pattern 23 is included in the field of view.

Returning back to discussion on FIG. 3, the operator selects the ROI at Step S305, and cuts out the selected ROI as an image for the training data. The tilt image is displayed on the main screen 401, and the operator selects, by a pointer 409 and a selection tool 410, a region including the marker pattern 23 desired to automatically be detected by the feature classifier 45. In a case of selection and edition of the image, the operator presses an "Edit" button in the operation panel 405 in the GUI illustrated in FIG. 4A. When this button is pressed, a tool for editing the image data, such as "cut", "copy", and "save", is displayed on the screen, and also the pointer 409 and the selection tool 410 are displayed on the main screen 401.

FIG. 4A presents a state in which one ROI is selected, and a marker 25 indicative of the ROI is displayed on the main screen 401. The operator uses the edition tool to cut out the selected region from the image data of the tilt image, and stores as the image data in the storage (Step S306). The stored image data serves as the training data used for the machine learning. Although in FIG. 4A only one ROI is selected, a plurality of ROIs may be selected. Note that, in the storing, not only the image data but also, for example, meta information including the optical condition such as the magnification and a scanning condition, and the stage condition (the condition related to setting of the sample stage 17), etc., at the time of the imaging, may be stored in the storage 903.

At Step S307, the operator inputs the acquired training data to the feature classifier 45 to perform training. A configuration example of a GUI screen used by the operator at the time of training is illustrated in FIG. 4B. The GUI screen illustrated in FIG. 4B is configured such that a training screen which is used at the time of training, a screen which is used at the time of field-of-view search, and a screen which is used at the time of auto capture (automatic capturing) of a high-magnification image, are switchable by using tabs. When a training tab 411 showing "train" is selected, this screen is displayed. In a case of displaying the GUI illustrated in FIG. 4B from a state where the screen is not displayed, when "Auto FOV search" is selected from select buttons which are displayed by the "Menu" button 406 in FIG. 4A being pressed, a pop-up display of a field-of-view search tool screen as illustrated in FIG. 4B appears.

In an upper row of the field-of-view search tool screen illustrated in FIG. 4B, an operation button set to execute a batch input mode in units of a folder in which the training data stored in the storage 903 is inputted into the feature classifier 45 in units of a folder, is placed. On the other hand, in a lower row of the field-of-view search tool screen, an operation button set to execute an individual input mode in which the training data is individually selected and displayed, and inputted into the feature classifier 45, is placed. The lower row of the field-of-view search tool screen includes a training data display screen 418. The switching between the batch input mode in the units of a folder and the individual input mode is performed by a tab 417 showing "Folder" being selected.

In a case where the batch input mode in the units of a folder is executed, first, an input button 412 is pressed to specify a folder storing the training data. A name of the specified folder is shown in a folder name display field 413. In order to change the specified folder name, a clear button 414 is pressed. A training start button 415 is pressed to start training of the model. Next to the training start button 504, a status display field 416 indicating a status is displayed. When "Done" is displayed in the status display field 416, the training step at Step S307 ends.

In a case where the training is performed in the individual input mode, the operator presses the input button 412 to specify the folder, and then, selects the "Folder" tab 417 to activate the lower-row screen. When the lower-row screen is activated, training data 43 stored in the specified folder is thumbnail-displayed on the training data display screen 418. The operator suitably inputs a checkmark to a checkmark input field 420 displayed in the thumbnail image. Note that the selected result can be cancelled by a clear button 423 being pressed. A sign 421 is the checkmark input field after the checkmark being inputted. The displayed thumbnail image can be changed by a scroll button 419 displayed on both ends of the screen being operated.

When the individual selection of the training data ends, the operator presses an enter button 422 to confirm the input result. After confirmation, a training start button 424 is pressed to start the training. Next to the training start button 424, a status display field cell 425 indicating a status is displayed, and when "Done" is displayed in the status display field cell 425, the training step in the individual input mode ends.

When the training is carried out to some extent, check operation to check whether the training is completed is executed (Step S308). The check operation can be executed by inputting, into the feature classifier 45, an image of a pattern having a known dimension to cause the feature classifier 45 to estimate the dimension, and determining whether a percentage of correct answers is above a given threshold. If the percentage of correct answers is below the given threshold, whether additional creation of training data is necessary (in other words, whether unused training data is stored in the storage 903) is determined (Step S309). If there is stock of the training data, and it is the training data suitable for the training, the process returns to Step S307 to execute additional training of the feature classifier 45. If stock of the training data does not exist, creation of new training data is determined to be necessary, and the process returns to Step S301 to again execute the flow in FIG. 3. If the percentage of correct answers is above the given threshold, the training is determined to be completed, and the operator ends the flow in FIG. 3.

As a method for the machine learning, an object detection algorithm using a deep neural network (DNN), or a cascade classifier may be used. When the cascade classifier is used, both of a positive image containing the marker pattern 23 and a negative image not containing the marker pattern 23 are set as the training data 43, and Step S307 in FIG. 3 is executed by using such training data.

Next, a field-of-view search sequence after the completion of the training is described with reference to FIGS. 5A to 7. FIG. 5A is a flowchart presenting the entire field-of-view search sequence. First, a new observation sample 20 is placed on the sample stage 17 (Step S501), and next, condition setting for the field-of-view search is performed (Step S502).

The condition setting step for the field-of-view search at Step S502 includes, as illustrated in FIG. 5B, an optical condition setting step for the field-of-view search (Step S502-1), and a stage condition setting step for the field-of-view search (Step S502-2). At this step, operation is performed by using a GUI 600 and a GUI 400 illustrated in FIG. 6A, and details thereof will be described later.

When the condition setting for the field-of-view search ends, a test run of the field-of-view search is executed (Step S503). The test run is a step in which a tilt image of the sample 20 is acquired at a magnification set in advance, and output of the center coordinates of the marker pattern from the feature classifier 45 is confirmed. Depending on the number of target imaging parts and the set magnification, the tilt image of the sample cross section may need one image or a plurality of images captured. In the case in which a plurality of images are captured, after the computer system 32 automatically transfers the sample stage 17 in the X-axis direction by a certain distance, an image is acquired, and then, after further transferring the sample stage 17 by a certain distance, an image is a acquired, which are performed repeatedly. The feature classifier 45 is operated with respect to the plurality of tilt images acquired in such a manner, and detects the marker pattern 23. The detection result is displayed on the main GUI 400 in a form in which the marker indicative of the ROI and the acquired image are displayed to be superimposed to each other. The operator confirms whether the ROI of the marker pattern included in the image is correctly extracted from the obtained output result.

As a result of the test run, if a problem occurs, a processing to solve the malfunction is performed at Step S504-2. The problem which may occur includes, for example, a case in which the marker pattern 23 within the field of view is not found and the center coordinates of the marker pattern 23 cannot be outputted even by the operation of the feature classifier 45, and a case in which a region other than the marker pattern 23 is erroneously recognized as the marker pattern 23, and incorrect center coordinates are outputted. When a problem related to the imaging device or the whole apparatus, such as failure in the optical system, occurs, the processing to execute the test run is temporally suspended.

In a case in which the test run goes well without occurrence of a problem, condition setting for image auto capture (i.e., image acquisition at a high magnification) is performed (Step S505). Note that the test run at Step S503 and the malfunction confirmation step at Step S504 may be omitted, and after the condition setting for the field-of-view search (Step S502), the process may be proceeded to the condition setting step for the image auto capture (Step S505) to start the actual performance without the test run.

Step S505 includes, as illustrated in FIG. 5C, an optical condition setting step for high-magnification imaging (Step S505-1), a stage condition setting step in a direct-front condition (Step S505-2), and a final observation position setting step (Step S505-3).

Here, a GUI used during the execution of the flowcharts in FIGS. 5B and 5C is described. FIG. 6A illustrates one example of the GUI 600 and the main GUI 400 as a main screen, which are used by the operator during the condition setting for the field-of-view search (Step S502).

The main GUI 400 is the same one as described with reference to FIG. 4A. As described above, when the operator selects the field-of-view search button from the select buttons displayed by the "Menu" button 406 being pressed, a pop-up display of a screen illustrated in the upper row in FIG. 6A appears. In a case in which the GUI illustrated in the upper row in FIG. 6A is not displayed, by a tab showing "FOV Search" being selected from field-of-view search tab 601, the screen is switched to the GUI illustrated in the upper row in FIG. 6A.

The GUI 600 illustrated in FIG. 6A can be used to set both of the imaging conditions for the field-of-view search and for the high-magnification image automatic capturing, and by a radio button of either one of an "FOV search" field 602 and a "High magnification capture" field 603 being pressed, setting screens for the respective settings are switchable. A panel for setting various setting items of the imaging condition is displayed below the radio button, and for example, in the case of FIG. 6A, a stage condition setting panel 604, a magnification setting panel 605, an ROI size setting panel 606, a final observation position setting panel 607, etc., are displayed. Although, for explanation, the configuration example of the setting panels which are displayed on both of the "FOV search" and "High magnification capture" screens are illustrated in FIG. 6A, in an actual situation, only a necessary setting panel is displayed on each screen.

The stage condition setting panel 604 is a setting field for registering, to the computer system 32, information on each of XYZ coordinates of the sample stage 17, a first tilt angle (the rotational angle about the first tilt shaft 61 in FIG. 2B), and a second tilt angle (the rotational angle about the second tilt shaft 62 in FIG. 2B). The tilt image of the sample cross section is displayed on the main screen 401 of the main GUI 400, and stage information in the condition of the image displayed on the main screen 401 is displayed in each display field of the X-coordinate information, the Y-coordinate information, the Z-coordinate information, the first tilt angle (the first tilt shaft 61 in FIG. 2B), and the second tilt angle (the second tilt shaft 62 in FIG. 2B) in the stage condition setting panel 604. In this state, when a registration button (Register) 612 is pressed, the current stage condition (the condition of the drive shafts) is registered into the computer system 32.

The registration can be cancelled by a clear button (Clear) 613 being pressed. The operation of the registration button 612 and the clear button 613 is in common in the following description. Note that an execution button (Run) 614 is a button to instruct the computer system 32 to start the field-of-view search, and by this button being pressed, Step S503 (test run) in FIG. 5A can be started. A resume button (Resume) 615 is a button to resume the flow when the flow automatically stops due to malfunction at Step S504 in FIG. 5A. When this button is pressed after the processing at Step S504-2 and the malfunction is resolved, the test-run flow can be resumed from the step at which the flow automatically stopped. When a stop button (Stop) 616 is pressed, the ongoing field-of-view search can be stopped halfway.

When an adjustment button 609 is pressed to finely adjust the field of view of the tilt image, each of the XYZ coordinates or the tilt angle of the sample stage 17 is changed in a positive or negative direction. The image after the change is displayed on the main screen 401 in real time, and the operator registers the condition of the sample stage 17 where the field of view which is determined to be most appropriate can be obtained, while looking at the image. Note that when the field of view is adjusted such that the direct-front image of the cut surface 21 is shown in the main screen 401 in the state where the "High magnification capture" is selected, the stage condition in this state is a stage condition in the direct-front condition. By this condition being registered to the computer system 32, Step S505-2 in FIG. 5C can be executed.

Moreover, the setting and registration of the stage direct-front condition may be performed through automatic adjustment based on a given algorithm other than the manual adjustment described above. As the algorithm for adjusting the tilt angle of the sample 20, an algorithm which acquires tilt images at various tilt angles, and calculates the tilt angles by numerical calculation based on an edge line of a wafer extracted from the images, may be adopted.

The magnification setting panel 605 is a setting field to set a final magnification for the high-magnification imaging, and a halfway magnification when the magnification is increased from the imaging magnification during the field-of-view search to the final magnification. In a right field of the part showing "Current", the imaging magnification of the tilt image which is currently displayed on the main screen 401 is displayed. A right side of "Final" in a middle row is a setting field to set the final magnification, and the final magnification is selected by an adjustment button similar to that in the stage condition setting panel 604. "Step*" in the lower row is a setting field to set a step number of the halfway magnification when counted from the imaging magnification of the tilt image, and when an adjustment button at a right side of the setting field is operated, a number is displayed in the "*" field. For example, in a manner of "Step1", "Step2", etc. On the further right side of the adjustment button at the right side of the setting field, a magnification setting field to set an imaging magnification at each step is displayed. The halfway magnification is set by the adjustment button being operated in the same manner as described above. After the setting ends, when the registration button 612 is pressed in the same manner as described above, the set final magnification and halfway magnification are registered to the computer system 32.

The ROI size setting panel 606 is a setting field to register the size of the ROI. When the number of pixels is set by using the ROI size setting panel 606, a range of the set pixels in the up-and-down and left-and-right directions centering the center coordinates of the ROI outputted by the feature classifier 45 is imaged. When the appropriate number of pixels is set by an adjustment button being operated, and then the registration button 612 is pressed, the set number of pixels is registered to the computer system 32.

The final observation position setting panel 607 is a setting field to set the center position of the field of view at the time of imaging at the final magnification, by a distance from the marker pattern 23. The main screen 401 shows the tilt image of the sample cross section together with the ROI 25 for the marker pattern setting. The operator drags and drops the selection tool 410 to a desired final observation position 426 by operating the pointer 409, and thus a relative positional information on the final observation position with respect to the marker pattern 23 can be set. On the final observation position setting panel 607, a distance from the center coordinates of the ROI 25 in the X direction is displayed in a "Left" display field or a "Right" display field, and a distance in the Z direction is displayed in an "Above" display field or a "Below" display field.

In a case in which a plurality of final observation positions are set, the drag-and-drop of the selection tool 410 is repeated, and thus the plurality of final observation positions are set. Moreover, as will be described later, a keyboard, a numeric keypad, etc., provided to the input unit 36 may be used to directly input a numerical value in each of the display fields of "Left", "Right", "Above", and "Below". This method is highly convenient for the operator in a case in which, for example, a plurality of images are captured on the basis of a position apart from the marker pattern 23 by a given distance, at a determined interval (for example, at equal intervals) from the reference position.

The setting of the optical conditions for the field-of-view search and the high-magnification image capturing are performed by using the GUI 400 which is the main GUI. In a state where the GUI 600 is displayed, when a button related to the optical condition in the selection panel 404 or the operation panel 405 in the GUI 400 is pressed, a screen to set the optical condition is displayed. For example, when a "Scan" button 427 is pressed, a scanning speed setting panel 608 is displayed, and the operator operates a setting thumb 611 while looking at an indicator 610, thus setting a scanning speed for the imaging to an appropriate value. When the registration button 612 is pressed after the setting, the set scanning speed is registered to the computer system 32. In the procedure as described above, by registering to the computer system 32 the optical conditions such as the acceleration voltage and a beam current value while switching the "FOV search" and the "High magnification capture", Step S502-1 in FIG. 5B and Step S505-1 in FIG. 5C can be executed. Note that a scanning speed for the tilt image capturing may be set to be higher than the image scanning speed at the final magnification. Moreover, the imaging device 10 is switchable of the scanning speed in accordance with the set speed.

Note that, in the description with reference to FIG. 6A, input of the numerical values to the display fields provided to the setting panels 604 to 607 can be performed by using the adjustment button 609. However, alternative or in addition to this, a keyboard, a numeric keypad, etc., provided to the input unit 36 may be used to directly input the numerical value.

Returning back to FIG. 5A, description of the flowchart is resumed. At Step S505, when the condition setting for the image auto capture ends, execution of the actual field-of-view search starts (Step S506). FIG. 6B illustrates a configuration example of a GUI used by the operator at the time of execution of the actual field-of-view search which is presented by the procedure at and after Step S506 in FIG. 5A. When the operator calls from the "Menu" button 406 shown in the main GUI 400, or selects an "Auto Capture" tab 619 from the field-of-view search tabs 601 in the GUI illustrated in FIG. 6A, the screen is switched to the GUI illustrated in FIG. 6B. When the operator presses a start button 617, the procedure at and after Step S506 in FIG. 5A starts.

At this step, a tilt image of a given region of the sample cross section is imaged. Image data obtained from the captured image is sequentially inputted into the classifier 45, and center-coordinate data of the marker pattern is outputted. The outputted center-coordinate data is provided with a serial number such as ROI1, ROI2, etc., and is stored in the storage 903 together with the meta information described above.

When the field-of-view search ends, the controller 33 calculates a transfer amount of the sample stage 17 based on the current stage positional information and the center-coordinate data of each ROI, and field-of-view shift to the marker pattern position 23 is executed (Step S507). After the field-of-view shift, a high-magnification image is acquired at the final observation position, in accordance with the image auto capture condition at the high magnification set at Step S505 (Step S508). Below, details of Step S508 is described with reference to FIG. 5D.

After the field of view is shifted to the position of the marker pattern 23 at Step S507 in FIG. 5A, the controller 33 executes field-of-view shift to the final observation position, in accordance with the relative positional information set in the final observation position setting panel 607 in FIG. 6A (Step S508-1). Next, the stage condition is adjusted to be the direct-front condition at Step S508-2. At this step, the controller 33 calculates a stage transfer amount based on a difference between the stage condition set in the "High magnification capture" in FIG. 6A and a stage condition at an end timing of Step S508-1 (or the stage condition set in the "FOV search"), and causes the stage 17 to move.

By execution of Step S508-1 and Step S508-2, the observation field of view shifts to the final observation position, and also becomes the direct-front condition with respect to the sample cross section, and then, the magnification is increased at the field of view (Step S508-3). The magnification is increased in accordance with the halfway magnification set in the magnification setting panel 605 in FIG. 6A.

At Step S508-4, the computer system 32 executes focus adjustment and astigmatism correction processing. As an algorithm for the correction processing, for example, a method in which an image is acquired while a current value of an objective lens and an astigmatism correction coil is swept within a given range, image sharpness is evaluated by the acquired image being applied with fast Fourier transform (FFT) or Wavelet transform, and a setting condition with a high score is derived. A correction processing of another aberration may be included as necessary. At step S508-5, the computer system 32 executes imaging at the increased magnification, and image data of the current field of view is acquired.

At Step S508-6, the computer system 32 executes a first field-of-view deviation correction. The first field-of-view deviation correction of this embodiment includes a correction processing of a horizontal line of the image, and correction processing of deviation of the field-of-view center position. However, another necessary field-of-view deviation correction processing may be executed according to the magnification.

First, the correction processing of the horizontal line is described. As illustrated in FIG. 2A, the observation sample of this embodiment is the coupon sample, and has the coupon sample upper surface 22 (wafer surface) where the marker pattern 23 is formed, and the cut surface 21. In the cross-section image of the cut surface 21 in the stage direct-front condition, the coupon sample upper surface 22 is visually recognized as an edge line. Therefore, at this step, the edge line is automatically detected from the image data acquired at Step S508-5, and field-of-view deviation within an X-Z plane of the acquired image is corrected such that the edge line matches a horizontal line (an imaginary reference line in the horizontal direction passing the field-of-view center) within the image. In detail, the processor 901 derives actual position coordinates of the edge line based on positional information of the edge line on the image, and the positional information of the sample stage 17, and the controller 33 adjusts the rotational angle of the first tilt shaft, and shifts the field of view such that the edge line is positioned at the center of the field of view. As an image processing algorithm to detect the edge line, straight line detection by Hough transform or the like may be used. Moreover, for further improvement in detection accuracy, a preprocessing in which the edge line is emphasized by being applied with Sobel filter etc., may be performed.

Next, the correction processing of deviation of the field-of-view center position is described. Immediately after the field-of-view shift at Step S508-1, although the position set in the final observation position setting panel 607 in FIG. 6A is positioned at the field-of-view center, the field-of-view center may be deviated after the observation magnification is increased at Step S508-3. Therefore, the computer system 32 extracts image data of an appropriate number of pixels around the field-of-view center from the image before the magnification increase, and executes pattern matching in the image data acquired at Step S508-5 while using the extracted image data as a template. Center coordinates of the region detected through the matching is the original field-of-view center, and the computer system 32 calculates a difference between the center coordinates of the detected region and the field-of-view center coordinates on the image data acquired at Step S508-5, and transmits the difference to the controller 33 as a control amount of the stage 17. The controller 33 moves, in accordance with the received control amount, the X-drive shaft or the Y-drive shaft, and the second tilt shaft depending on the magnification, thus correcting the deviation of the field-of-view center.

Note that in a case in which the computer system 32 is provided with another feature classifier which has been trained by using the image obtained in the magnification increasing process as training data, the center-coordinate data of the field of view may be obtained by directly inputting the image data acquired at Step S508-5 into the another feature classifier, without using the template matching.

Moreover, the field-of-view deviation correction at this step may be executed not by adjustment of the sample stage 17, but by image shift. In this case, an adjustment amount of field-of-view deviation is converted, by the computer system 32, into control information related to the scanning region by the electron beam in the X and Y directions, and sent to the controller 33. The controller 33 controls the deflection coils 14 based on the received control information, and executes the adjustment of the field-of-view deviation by the image shift.

At Step S508-7, it is determined whether the adjustment amount in the first field-of-view deviation correction executed at Step S508-6 is appropriate. In FIG. 2B, since a height of the sample 20 (a distance between the cut surface 21 and its opposed surface) is already-known, a distance R between a rotational center of the second tilt shaft 62 and the cut surface 21 is also already-known. In a case in which the field-of-view deviation correction using the second tilt shaft 62 is executed at Step S508-6, in principle, a rotational angle θ of the second tilt shaft is adjusted such that a product Rθ of the rotational angle θ of the second tilt shaft and the distance R is equal to a field-of-view shift amount on the image. However, measuring the R strictly accurately is difficult because of various reasons, such as horizontal accuracy of the wafer placing surface of the sample stage 17 and the inclination of the cut surface 21 (attributed to the shape of the sample). Therefore, the rotational angle θ calculated at the first field-of-view deviation correction step may be insufficient or excessive due to the accuracy of the R. Moreover, even the field-of-view deviation correction by the adjustment of the X-drive shaft or the Y-drive shaft may cause a case in which the original field-of-view center is not positioned at the field-of-view center on the image after the field-of-view deviation correction, because of a machine accuracy problem, etc. If the adjustment amount is not appropriate, the processing proceeds to Step S508-8, and if the adjustment amount is appropriate, the processing proceeds to Step S508-9.

At Step S508-8, a second field-of-view deviation correction is executed. In the second field-of-view deviation correction, a deficiency or an excess in the adjustment amount of the rotational angle θ, or the adjustment amount of the X-drive shaft or the Y-drive shaft is obtained by image processing, and the stage 17 is re-adjusted. In the case in which the original field-of-view center is not positioned at the field-of-view center, at Step S508-8, the image before the execution of the specified distance transfer, and the image after the execution of the transfer is compared, an actual transfer distance is measured, and correction is executed by adding the deficient amount. In a case in which a target object for the above-described processing does not exist in the field of view, the magnification is changed to a lower magnification, and the above-described processing is executed after an image-classifiable target object is brought within the field of view.

Note that the second field-of-view deviation correction of this step may be executed not by adjustment of the sample stage 17, but by image shift. The first field-of-view deviation correction processing and the second field-of-view deviation correction processing described above may comprehensively be referred to as "fine adjustment".

At Step S508-9, it is determined whether the current imaging magnification matches the final observation magnification set in the magnification setting panel 605 FIG. 6A. If the current imaging magnification matches, the processing proceeds to the next Step S508-10. If the current imaging magnification does not match, the processing returns to Step S508-3, and the processing from Step S508-3 to Step S508-8 is repeated.

At Step S508-10, the optical condition is changed to the optical condition for the high-magnification image capturing which is set in the GUI 400 in FIG. 6A, and at Step S508-11, imaging is executed in accordance with the optical condition. Step S508 ends by the procedure described above, and the processing proceeds to Step S509 in FIG. 5A.

At Step S509, it is determined, based on the serial number of the ROI imaged at Step S508, whether imaging at the final observation positions ends for all the ROIs extracted in the field-of-view search. If the imaging does not end, the processing returns to Step S507 to execute the field-of-view shift to the next ROI. If the imaging ends, the automatic capturing processing of this embodiment ends (Step S510).

During the execution of the automatic capturing processing, a status of the automatic capturing processing is displayed on the GUI illustrated in FIG. 6B. A rate of the imaged ROI to all the ROIs is displayed in a status bar 618, and furthermore, a serial number of the captured or ongoingly-captured image, the coordinates (stage condition) thereof, and the serial number of the ROI corresponding to the marker pattern of each imaging part, are displayed in a captured-image detail field 620.

FIG. 7 illustrates a state of the main GUI 400 after the sequence for the automatic capturing processing ends. On the main screen 401, the captured high-magnification image is displayed, and on the sub screen 407, the tilt image of the cut surface 21 is displayed in a wider field of view compared to the main screen 401. In the image listing section 408, a high-magnification image of each imaging part is thumbnail-displayed.

The high-magnification image displayed on the main screen 401 is a cross-section image at a high magnification at which the shape of a processed pattern 26 formed on the wafer can be confirmed, and the magnification is ×200k as shown in the magnification adjustment field 403. Moreover, for displaying the imaging part of the high-magnification image to be emphasized, the marker pattern and a marker 428 indicating the final imaging position are displayed on the sub screen 407.

As described above, as a result of building the feature classifier 45 for the marker pattern 23 by using a set of 250 pieces of training data and a cascade classifier, and implementing in the apparatus the flow presented in FIGS. 5A to 5D as the automatic capturing sequence, a preferable automatic cross-section observation operation was confirmed.

Second Embodiment

Next, a scanning electron microscope according to a second embodiment is described. The second embodiment proposes a scanning electron microscope provided with the sample stage 17 having a structure different from that in the first embodiment. The target sample, and the building methods of the automatic capturing flow and the field-of-view recognizing function are the same as those in the first embodiment, and the configuration of the sample stage 17 is different. FIG. 8A illustrates a schematic view of the sample stage 17. In this embodiment, the second tilt shaft 62 is provided along the Z direction in the drawing. Furthermore, the first tilt shaft 61 is provided to a pedestal 17X disposed on a lower side of the sample stage 17 provided with the second tilt shaft 62. The upper surface 22 of the sample 20 is fixed orthogonally to the upper surface of the sample stage 17 by using a fixing jig.

FIG. 8B shows a state in which the second tilt shaft 62 is rotated by 90° (the drawing sheet shows the Y-Z plane) from the state shown in FIG. 8A (the drawing sheet shows the X-Z plane). In this arrangement, the upper surface 22 and the first tilt shaft 61 are orthogonal to each other, and the state similar to FIG. 2B in the first embodiment can be obtained. By the first tilt shaft 61 being rotated from this state, the inclination of the cut surface 21 with respect to the electron beam 12 can be adjusted. Moreover, when a tilt image is acquired to search the marker pattern 23, the first tilt shaft 61 is rotated after being returned to the state illustrate in FIG. 8A, and thus the tilt image can be observed. Note that, although not illustrated, the sample stage of this embodiment is provided with the X-drive shaft and the Y-drive shaft to independently transfer the sample placing surface in the X and Y directions, and the observation field of view can parallelly be shifted in the longitudinal direction of the sample.

Third Embodiment

Next, a scanning electron microscope according to a third embodiment is described. In the third embodiment, a sequence which can shorten the entire execution time compared to the automatic capturing sequence discussed in the first embodiment is described. The entire configuration of the charged particle beam apparatus which executes the automatic capturing sequence, and a GUI used by an operator according to the third embodiment are similar to those in the first embodiment, and thus redundant description is omitted below. Mainly, different points are described while referring to FIGS. 1, 4A and 4B, and 6A and 6B as necessary.

With reference to a flowchart in FIG. 9, a flowchart of a substantial part of the automatic capturing sequence of the third embodiment is described. The overall flow of the automatic capturing sequence is similar to the flow presented in FIG. 5A. However, processing executed at the time of high-magnification imaging at the final observation position at Step S508 is different from the processing in the first embodiment presented in FIG. 5D.

In the flowchart in FIG. 9, the processing from Step S508-1 to Step S508-5 are the same as that in the flowchart in FIG. 5D. After an image is acquired at the increased magnification at Step S508-5, edge-line detection processing is executed at Step S508-6-1 by using a given image processing algorithm. After the execution of the detection processing, a processing to determine whether the detection is successful is executed at Step S508-6-2. If an edge line is not detected, the processing proceeds to Step S508-6-3, and focus adjustment and astigmatism correction are executed by using the image data captured in the same field of view and at the same magnification. If an edge line is detected, the processing proceeds to a determination step at Step S508-6-4.

At Step S508-6-4, a processing to determine whether to skip a processing from Step S508-6-5 to Step S508-6-8 is executed. A determination criterion is whether the current magnification is higher or lower than a threshold set in advance (whether the current magnification is at or above the threshold may be determined). This is because, when the magnification is low, an amount of field-of-view center deviation on the image, attributed to the magnification increase, is small (a possibility that the original field-of-view center deviates from the field of view is low). Empirically, it is known that the amount of field-of-view center deviation increases to an extent to deviate from the field of view when the magnification is approximately from ×50k to ×100k. Moreover, at the time in which the magnification is increased from the imaging magnification for the field-of-view search to the final observation magnification, it is desirable to increase the magnification in a phased manner to avoid occurrence of field-of-view shift. The magnification setting for the halfway magnification in the GUI in FIG. 6A is desirably performed in at least approximately four phases or more.

If the current magnification is determined to be larger than the threshold at Step S508-6-4, deviation correction of the field-of-view center at Step S508-6-5 is executed. This processing is similar to the processing of the field-of-view center deviation correction included in the "first field-of-view deviation correction" at Step S508-6 in FIG. 5D, and thus description thereof is omitted. Thereafter, Steps S508-7 and S508-8 are executed in the same procedure as presented in the FIG. 5D, and once executed, the processing proceeds to the next step S508-9. On the other hand, if the current magnification is determined to be at or below the threshold at Step S508-6-4, the processing at Steps S508-6-5 to S508-6-8 is omitted, and the processing proceeds to Step S508-9.

Thereafter, the determination step at Step S508-9 and the optical condition changing step at S508-10 are executed, and then the target high-magnification image is acquired at Step S508-11. The processing at these steps is already described in the first embodiment, and thus description thereof is omitted.

According to the automatic capturing sequence of the third embodiment, the focus adjustment and the astigmatism correction in the magnification increasing process, and also the first field-of-view deviation correction and the second field-of-view deviation correction can be omitted depending on the situation. The optical adjustment such as the focus adjustment and the astigmatism correction, which takes long time, and the image processing such as the first field-of-view deviation correction and the second field-of-view deviation correction, which takes long time can be skipped, and therefore, the total time required for a series of observation flow can be reduced. Furthermore, the reduction effect increases as the number of capturing images on the sample increases. Note that only one of the determination steps at Steps S508-6-2 and S508-6-4 may be adopted to configure the flow (that is, a flow in which only the focus adjustment and the astigmatism correction, or the first field-of-view deviation correction and the second field-of-view deviation correction are skipped), and also in this case, the reduction effect of the total time required may be obtained. As described above, according to the automatic capturing sequence of the third embodiment, a charged particle beam apparatus with large capturing throughput with respect to the cross-section image is achievable.

Fourth Embodiment

Next, a scanning electron microscope according to a fourth embodiment is described. The scanning electron microscope of the fourth embodiment is different from the embodiments described above in that layout data such as design data is used to build the feature classifier 45 for the marker pattern 23.

FIG. 10 illustrates a configuration example of the scanning electron microscope 10 suitable for the fourth embodiment. Although a basic configuration is similar to that in the first embodiment, a configuration of the computer system 32 is different in the fourth embodiment. In the computer system 32 provided to the scanning electron microscope 10 of the fourth embodiment, layout data 40 is stored in the storage 903. Moreover, the computer system 32 is provided with, as a functional block of the field-of-view search tool 904, a cross-section 3D image data generation unit 41 and a similar image generation unit 42.

An external server 905 is connected to the computer system 32 directly or through a network. In FIG. 10, a state where the respective functional blocks are developed in a memory space of the memory 902 is illustrated. Below, the function of each of the cross-section 3D image data generation unit 41 and the similar image generation unit 42 is described.

With reference to FIG. 11, a building procedure of the feature classifier 45 according to the fourth embodiment is described. A diagram illustrated in an upper row in FIG. 11 is a configuration example of a GUI to set an ROI on design data. When an operator presses a "CAD" button 430 in the operation panel 405, operation buttons as illustrated are displayed. When the operator selects a desired layout data from CAD file (layout data) displayed in a CAD file name display field 431, and presses a "Load" button, layout data stored in the storage 903 is read to the memory 902. The operator sets a cut line 71 by using the pointer 409 with referent to the layout data 40 displayed on the main GUI 400, and presses a "Register" button 432 to register the cut line 71 to the computer system 32. Here, the cut line 71 corresponds to a location where the actual sample 20 is cut. When a "Clear" button 433 is pressed, the registration can be canceled.

Although the layout data 40 is device design data such as CAD, alternative to this, a two-dimensional image generated based on the design data, a photograph observed by using an optical microscope, and the like may be used. In this layout diagram, a region indicated by a reference numeral 70 corresponds to a side remained as an observation sample.

Next, the operator sets, on the layout data 40 by using the pointer 409 and the selection tool 410, the region of interest (ROI) 25 including the marker pattern 23 to automatically be detected during the observation. After the setting, the operator presses the registration button 432 to register the region of interest (ROI) 25 to the computer system 32.

After the setting of the cut line 71 and the ROI 25, in response to instruction by the operator, the cross-section 3D image data generation unit 41 starts processing to generate a 3D geometric image 72 (pseudo tilt image) from the layout data 40. A method of the instruction by the operator is, for example, a method in which the operator presses a button on a GUI (not illustrated) to start a generation processing of training data from the layout data. When the start button is pressed, the processor 901 executes a program of the cross-section 3D image data generation unit 41, and a three-dimensional (3D) model is built on the computer system 32 based on the layout data corresponding to the ROI 25. The processor 901 further changes a tilt angle and an observation scale of the 3D model on an imaginary space, and thus a plurality of 3D geometric images 72 with different observation conditions are automatically generated. A second row in FIG. 11 shows three examples of the 3D geometric images 72 with different tilt angles, generated by the computer system 32. Each generated 3D geometric image 72 includes the cut surface 21 of the wafer and the region of interest (ROI) 25 as illustrated in FIG. 11.

The processor 901 automatically executes, by using coordinate information of the ROI 25 specified on the main GUI 400, an image cutout processing in which a region including the ROI is cutout on the 3D geometric image 72, and generates a 3D tilt image 73. A third row in FIG. 11 shows three examples of a schematic view of the 3D tilt image 73 generated from the 3D geometric image 72. A size of the ROI cutout region is set to a size two to four times an area of the ROI while including the ROI and the cut surface 21. The similar image generation unit 42 generates similar image 74 similar to an SEM observation image, based on the 3D tilt image 73 and a given algorithm. The similar image 74 which is automatically generated in the procedure described above can be used as the training data for the feature classifier 45.

A method for generating the similar image 74 is described in detail. As illustrated in FIG. 12, in this embodiment, an image style transfer model 46 is used to generate the similar image 74 from the 3D tilt image 73. The image style transfer model 46 is an image style transfer algorithm to generate the similar image 74 by reflecting image style information included in a style image 75 on the 3D tilt image 73 which is a structure image, and the image style transfer model 46 is embedded in the similar image generation unit 42. Since the image style information extracted from the style image 75 is reflected, the similar image 74 is configured to be more similar to an actual SEM observation image (real image) than the 3D tilt image 73.

The image style transfer model 46 includes a neural network, for example. In this case, learning can be carried out by using a data set for image recognition model learning, without using an actual sample image or the layout data 40. In a case in which a data set of a structure image similar to the target generation image, and the real image (actual SEM observation image corresponding to the 3D tilt image 73) exists, the data set may be used for learning of the image style transfer model. In such a case, since the image style transfer model can directly output the similar image from the 3D tilt image, a style image is not required when the similar image 74 is generated from the 3D tilt image 73. Furthermore, instead of the image style transfer model 46, an electron beam simulator may be used to generate the similar image 74.

Note that the cross-section 3D image data generation unit 41 and the similar image generation unit 42 may be operated in the external server 905 as illustrated in FIG. 10, and the similar image 74 may be stored in a storage 906. In this case, the cross-section 3D image data generation unit 41 and the similar image generation unit 42 are not required to be provided to the computer system 32 which is directly connected to the imaging device (scanning electron microscope) 10, and the similar image 74 stored in the storage 906 is used by being copied to the computer system 32 at the time of training of the feature classifier 45. Furthermore, by using the external server 905 as a calculator for creation of the image data for training of the feature classifier 45, the charged particle beam apparatus 10 can be dedicated to imaging. Therefore, there is an advantage that even when a sample to be an imaging target is changed, imaging can be continued in a seamless manner.

The similar image 74 generated in the procedure described above is stored in the training data DB 44 in the storage 903. In the case in which the training of the feature classifier 45 is performed by using the generated similar image 74, in the same procedure as the operation described with reference to FIG. 4B in the first embodiment, the folder storing the similar image 74 is selected from the training data DB 44, or an appropriate similar image 74 is individually selected, and the training start button 415 or 424 is pressed, so that the training is automatically started.

The charged particle beam apparatus described in the fourth embodiment does not require the operator to prepare the training data 43 by capturing a large amount of SEM images in order to build the feature classifier 45. The training data is automatically registered to the training data DB 44 only by the operator setting the cut line 71 and the region of interest (ROI) 25 with reference to the layout data 40, and the feature classifier 45 can be built. This means that the charged particle beam apparatus of this embodiment can substantially omit the process from Step S301 to Step S306 in FIG. 3, and it can easily be understood that a work load of the operator is largely reduced.

Fifth Embodiment

Next, a scanning electron microscope according to a fifth embodiment is described. In the fifth embodiment, a method of field-of-view search (automatic detection of the marker pattern 23) by using the similar image 74 generated in the method in the fourth embodiment is described. In this embodiment, not the feature classifier 45 by machine learning, but pattern matching is used for detection of the marker pattern 23.

The 3D tilt image 73 and the similar image 74 are generated from the layout data 40 in a method similar to that in the fourth embodiment. In conventional pattern matching, as mentioned in the problem discussed earlier, acquiring a large amount of actual observation images in various conditions are required as reference images for the pattern matching, and a practical problem exists. On the other hand, in the method of this embodiment, the similar image 74 generated from the layout data 40 can mechanically be outputted, and thus a large amount of reference images for pattern matching can be prepared without human effort. Therefore, pattern matching from a tilt image, which has conventionally been difficult, becomes achievable.

Sixth Embodiment

Next, a scanning electron microscope according to a sixth embodiment is described. The sixth embodiment proposes a configuration to supplementarily support a part of observation operation by an operator. In the sixth embodiment, the feature classifier 45 for the marker pattern 23 is built in any one of the methods described in the first embodiment to the fourth embodiment. Then, the operator causes the feature classifier 45 to operate during SEM observation so as to detect the marker pattern 23 in real time. At the same time, a function to display the region of interest (ROI) 25 including the detected marker pattern 23 on a GUI 400 of the display unit 35 is provided.

FIG. 13 illustrates a configuration example of a GUI screen provided to the charged particle beam apparatus of the sixth embodiment. The main screen 401 displays an observation image and a various operation menu. When the operator presses the "Menu" button 406, select buttons 434 are displayed, and when a "Marker" button is selected, a marker 50 indicative of the ROI extracted by the feature classifier 45 is displayed to be superimposed on the SEM image displayed on the main screen 401. Since all the ROIs extracted by the feature classifier 45 are displayed, in FIG. 13, the marker 50 is displayed to be superimposed on each of the plurality of ROIs. By the marker display function of this embodiment, the operator can immediately recognize where he or she is observing, which has an effect to improve efficiency of the observation operation. Particularly, this function is useful in a case of manual field-of-view search.

Seventh Embodiment

Next, a scanning electron microscope according to a seventh embodiment is described. The seventh embodiment provides a configuration example which achieves automatic alignment of layout data such as design data, and a sample position in actual SEM observation. Note that the feature classifier 45 of the computer system 32 is already trained by using a real image or a pseudo SEM image.

Operation on the layout data in the seventh embodiment is described with reference to FIG. 14A. FIG. 14A illustrates an observation target object in the seventh embodiment, and a plurality of marker patterns 23 having similar shapes are formed on the sample 20. Although only the schematic view of the sample 20 is illustrated in FIG. 14A, in an actual situation, it is displayed on a GUI similar to FIGS. 4A, 11, 13, etc.

An operator reads out, on the GUI, the desired layout data 40 in the same procedure as described in the fourth embodiment, and sets, on the GUI, the cut line 71 of the sample and the position (X coordinate) of the marker pattern 23 as the detection target object with reference to the layout data 40. The position setting of the cut line 71 and the marker pattern 23 is performed by using the pointer 409 and the selection tool 410 similarly to FIG. 11.

Through this operation, the X coordinate of each marker pattern 23 on the layout data is registered to the computer system 32, and an X-coordinate list 77 on the layout data is obtained. Next, a tilt image at a low magnification is acquired while the sample stage 17 is transferred in the X-axis direction in a step-and-repeat method. This imaging processing is performed from a position where a X-direction left end of the sample 20 is brought within a field of view, to a position where a right end thereof is brought within a field of view. During this process, as illustrated in FIG. 14B, an X position coordinate of the center of the region of interest (ROI) 25 of the marker pattern 23 which is automatically detected by the feature classifier 45 is stored as data. In such a manner, an X-coordinate list 78 in a real space is obtained.

In the method described above, as illustrated in FIG. 14C, the X-coordinate list 77 on the layout data, and the X-coordinate list 78 in the real space are obtained. By comparison of both the lists, transformation data to associate the coordinate on the layout and the coordinate in the real space is generated, and coordinate alignment of the layout space and the real space is achieved. The generated transformation data may be stored not only in the storage 903 of the computer system 32, but also in the external server 905.

FIG. 15 is a view illustrating a GUI in a state in which one of the thumbnail images displayed in the image listing section 408 is selected after the execution of the coordinate alignment processing. The layout data 40 is displayed on the sub screen 407 next to an observation image 51 (here, a tilt image), and the position of the observation image is reflected on the layout data 40 by the transformation data 80. Therefore, the operator can confirm, on the layout data 40, where he or she is measuring, and thus operability improves.

Moreover, at the same time, shifting the observation field of view to the observation position specified on the layout data 40 can easily be achieved. The same holds for a case in which the displayed image is a high-magnification image captured at the final magnification.

Next, with reference to FIG. 16, a case is described, in which the coordinate alignment of this embodiment is applied to the field-of-view search in the case where the feature classifier is built by using the similar image according to the fourth embodiment. Processing other than Step S502 is similar to that in the first embodiment (FIG. 5A), and thus Step S502 is described below.

FIG. 16 is a flowchart presenting details of Step S502. First, the operator sets the optical condition and the stage condition for the field-of-view search at Steps S501-1 and S502-2. Next, at Step S502-3, the operator sets the ROI on the layout pattern in the procedure as described with reference to FIGS. 11 and 14A. Then, when the operator presses an "Align" button 435 displayed on the operation panel 405 in FIG. 15, the computer system 32 displays on the operation panel 405 instruction buttons for the alignment processing. When a "Start" button is pressed, the computer system 32 starts capturing of a tilt image at Step S502-4.

Image data of the captured tilt image is sequentially stored in the storage 903, and when the imaging from the tip to end of the sample 20 in the X direction ends, the imaging step ends. Next, at Step S502-5, the processor 901 executes the comparison processing of the X-coordinate list 77 and the X-coordinate list 78 illustrated FIG. 14C, and the transformation data generation processing described above, and thus the coordinate alignment of the layout and the real space is executed. The generated transformation data is used for setting of the center coordinates of the ROI to which the field of view is shifted next, at the time of the field-of-view search test run at step S503 or the field-of-view shift to the target pattern at Step S507 in FIG. 5A, and also the transfer amount of the stage 17 is calculated by using this value. Therefore, the charged particle beam apparatus provided with the field-of-view search function in which only the layout data but not a real image is used can be achieved.

Moreover, the transformation data which associates the layout space and the real space coordinate may be utilized not only during searching for the marker pattern, but also during the field-of-view shift to the final observation position. Since coordinate deviation does not occur in the layout data even when it is displayed in an enlarged manner, by the layout data being displayed on the GUI to be enlarged, the operator can precisely specify the final observation position on the layout data at a resolution corresponding to the final observation magnification. Furthermore, the transformation data also allows the computer system 32 to precisely grasp the coordinate of the final observation position in the real space, and thus field-of-view deviation attributed to the magnification increase is eliminated in principle (in an actual situation, field-of-view deviation occurs due to error contained in the transformation data). This effect is similarly applied to the case in which the feature classifier 45 is built by using the real image as the training data.

Note that although in the above description the coordinate data of the marker pattern in the real space is used to calculate a stage transfer amount, pattern pitch information of the marker pattern may be used to calculate the stage transfer amount.

Eighth Embodiment

Next, a scanning electron microscope according to an eighth embodiment is described. In the eighth embodiment, a configuration example in which the disclosure is applied to observation of not a semiconductor sample but a metallic material structure is described. In a cross section of a metallic material structure, a feature structure such as a peritectic structure and a eutectic structure appears, and an operator performs field-of-view observation and detailed analysis such as elementary analysis, while focusing on the feature structure. In the following description of this embodiment, a premised apparatus configuration is the same as that in the embodiments described above as illustrated in FIG. 1 or 10.

A peritectic structure illustrated in FIG. 17A includes an A phase, a B phase, and a C phase, and a eutectic structure illustrated in FIG. 17A includes a D phase and an E phase. In this embodiment, similarly to the first embodiment, the training data 43 generated from an observation image which is acquired in advance is prepared, and the feature classifier 45 is built based thereon. As illustrated in FIG. 17A, the feature classifier of this embodiment may include a plurality of feature classifiers, and in the case of FIG. 17A, a feature classifier A 45*a* and a feature classifier B 45*b* respectively corresponding to the peritectic structure (first feature part) and the eutectic structure (second feature part) are built. The feature classifier A 45*a* and the feature classifier B 45*b* are trained in advance by using training data in which input is image data captured at a first magnification, and output is positional information of the peritectic structure or the eutectic structure.

When image data of a metallic structure surface acquired by the imaging device is inputted into the built feature classifier A 45*a* and the feature classifier B 45*b*, as schematically illustrated in FIG. 17B, center coordinates of regions of interest (ROI) 90 and 91 corresponding to the respective feature structures are automatically extracted. The computer system 32 instructs the controller 33 to shift the field-of-view center of the imaging device to the automatically extracted center coordinates, and the controller 33 controls the transfer of the sample stage 17 in accordance with the instruction by the computer system 32.

FIG. 17C illustrates a configuration example of a GUI used at a time of an automatic execution processing of elementary analysis executed in the eighth embodiment. When an operator selects an "Elementary Analysis" button from the select buttons 434 illustrated in FIG. 13, the GUI in FIG. 17C is displayed. The operator can set a type of analysis to be performed to the peritectic structure or the eutectic structure by using this screen.

The GUI in FIG. 17C has a target input field 1701 where a phase and a material as an analysis target object is inputted. The operator uses the input unit 36 etc. illustrated in FIGS. 1 and 10 to perform the input. Moreover, the GUI in FIG. 17C has an analysis type input field 1702 where a type of analysis to be executed is inputted. Similarly to the target input field 1701, the operator uses the input unit 36 etc. to perform the input. An input result is displayed in an input result display field 1703 as a list.

After completion of the setting described above, when a start button 1704 is pressed, an automatic execution flow of the elementary analysis starts, a newly captured image data of the metallic material structure is inputted into the feature classifier A 45*a* and the feature classifier B 45*b*, and the peritectic structure and the eutectic structure contained in the metallic material structure are extracted as the ROI together with information on the center coordinates. Based on the image data of the extracted ROI, positional information of the A phase, the B phase, the C phase, the D phase, and the E phase are obtained in units of a pixel by using a contrast.

For detection of the positional information of each phase, a method of machine learning such as semantic segmentation may be used.

Then, by the computer system 32 and the controller 33 working together, the field-of-view shift to the respective ROIs are automatically executed in order, and an imaging processing at a high magnification (a second magnification higher than the first magnification), and an elementary analysis (EDX mapping, EDS, etc.) processing with respect to the focusing field of view specified by the operator in the GUI, are automatically executed. Such an embodiment is significantly effective particularly in development in which a large amount of data is highly efficiently acquired like materials informatics. Note that, different from the other embodiments described above, in this embodiment, a tilt image is not required to be used for the training of the feature classifier, and training of the feature classifier is also possible by using an image captured from above the sample.

Ninth Embodiment

Next, a scanning electron microscope according to a ninth embodiment is described. The ninth embodiment proposes an example in which the technology of the disclosure is applied to a charged particle beam apparatus provided with an FIB-SEM (Focused Ion Beam-Scanning Electron Microscope) as an imaging device.

FIG. 18 illustrates a configuration of the FIB-SEM of this embodiment. An FIB casing 18 is provided to the same casing as the scanning electron microscope 10, forms a cross section of the sample 20 while cutting the sample, and performs shape and structure observation by the SEM. A component related to field-of-view recognition is similar to that in the fourth embodiment. In this embodiment, the computer system 32 is not a general-purpose processor and memory, and hardware such as an FPGA configures the respective functional blocks. However, functions and operation thereof are similar to those in the embodiments described above. Moreover, in this embodiment, layout data is used to generate the feature classifier 45. However, this embodiment may be applied to a configuration like the first embodiment in which image data obtained through actual observation is used as training data.

Tenth Embodiment

Other than the embodiments described above, configuration examples having the following features are also suitable.

1. A charged particle beam apparatus having a function to execute a field-of-view search test run based on instruction by an operator, and a recording medium storing a program to implement the function.

2. A charged particle beam apparatus having a function to detect a problem caused during execution of field-of-view search and automatically stop the field-of-view search, and a recording medium storing a program to implement the function.

3. The charged particle beam apparatus of the above section, having a function to resume a flow of the field-of-view search which is automatically stopped, from a process where the flow is stopped, and a recording medium storing a program to implement the function.

4. A charged particle beam apparatus including a GUI which displays design data of an observation target object sample, a computer system which executes a processing to match, based on a real image data acquired by an imaging device, coordinate information of an ROI set by an operator on the design data and coordinate information of the observation target object sample in a real space, and calculation of a sample stage transfer amount based on coordinate information of the ROI in the real space obtained through the matching, and a stage which moves based on the calculated stage transfer amount, and a recording medium storing a program to implement the processing.

5. The charged particle beam apparatus described above, having a function to execute field-of-view shift in the real space based on coordinate information of a final observation position set by the operator on the design data, and a recording medium storing a program to implement the function.

6. A charged particle beam apparatus comprising an imaging device and a computer system storing a first feature classifier trained by using real image data including a first shape and a second feature classifier trained by using real image data including a second shape, wherein automatic execution of elementary analysis is performed by radiating a charged particle beam to regions on a sample corresponding to a first coordinate and a second coordinate which are outputted by new image data being inputted into the first feature classifier and the second feature classifier, and a recording medium storing a program to implement the automatic execution processing.

7. The charged particle beam apparatus described above, including a GUI to set a type of elementary analysis to be executed to each of the first shape and the second shape, wherein the elementary analysis set on the GUI is automatically executed by a charged particle beam being radiated to the regions on the sample corresponding to the first coordinate and the second coordinate, and a recording medium storing a program to implement the automatic execution processing.

Note that the present invention is not limited to the above-described embodiments, but includes various modifications. The embodiments provide detailed description such that the description of the invention is easy to understand, and the invention is not limited to include all the described configurations. Moreover, a partial configuration of one embodiment may be replaced by the configuration of an other embodiment, and the configuration of one embodiment may be added to the configuration of an other embodiment. Furthermore, in terms of a partial configuration of each embodiment, addition of an other configuration, deletion, and replacement are possible. Moreover, each configuration, function, processing unit, processing means, etc., described above may be implemented by hardware by, for example, a part of or all of them being designed by an integrated circuit etc.

REFERENCE SIGNS LIST

10: electron microscope
11: electron gun
12: electron beam
13: condenser lens
14: polarization coil
15: objective lens
16: secondary electron detector
17: sample stage
18: FIB casing
20: sample
21: sample cut surface
22: sample upper surface
23: marker pattern

24: cross-section-observation field of view
25: marker pattern ROI
26: processed pattern
31: image forming unit
32: computer system
33: controller
34: image processing unit
35: display unit
36: input unit
40: layout data
41: cross-section 3D image data generation unit
42: similar image data generation unit
43: training data
44: training data DB
45: feature classifier
46: image style transfer model
50: GUI
51: observation image
61: first tilt shaft
62: second tilt shaft
70: observation target object side
71: cut line
72: 3D geometric image
73: 3D tilt image
74: similar image
75: style image
76: marker pattern coordinate
77: X coordinate list on layout data
78: X-coordinate list in the real space
79: observation position display
80: coordinate transformation data
90: peritectic structure ROI
91: eutectic structure ROI
100: secondary electron
900: interface
901: processor
902: memory
903: storage
904: field-of-view search tool
905: external server
906: storage

The invention claimed is:

1. A charged particle beam apparatus, comprising:

an imaging device configured to acquire image data of a sample at a given magnification by radiating a charged particle beam to the sample;

a computer system configured to execute arithmetic processing for field-of-view search at the time of acquisition of the image data, by using the image data; and a display unit on which a graphical user interface (GUI) to input a setting parameter for the field-of-view search is displayed, wherein the imaging device is provided with a sample stage configured to be capable of transferring the sample by at least two drive shafts, and shifting an imaging field of view corresponding to positional information of the sample, the positional information being obtained by the computer system, the computer system includes a classifier configured to output, in response to input of image data of a tilt image of the sample where the sample is imaged in an inclined state with respect to the charged particle beam, positional information of one or more feature parts existing on the tilt image, the classifier is trained in advance by using training data in which input is the image data of the tilt image, and output is positional information of the feature part, the computer system executes, with respect to new tilt image data inputted into the classifier, a processing to output positional information of the feature part, and the classifier is trained by using, in addition to the training data, training data in which input is a pseudo tilt image generated from layout pattern data of the sample, and output is positional information of a feature part existing on the pseudo tilt image.

2. The charged particle beam apparatus according to claim 1, wherein the GUI displays a first setting field to set relative positional information of a final observation position to the feature part, and the sample stage is configured to be controlled so that a field of view of the imaging device is shifted to the final observation position in accordance with the relative positional information set in the first setting field.

3. The charged particle beam apparatus according to claim 2, wherein the GUI displays a registration button to register a condition of the at least two drive shafts in which a cross section of the sample is at a direct-front position with respect to the charged particle beam, and after the field of view is shifted to the final observation position, the sample stage is configured to be controlled to adjust the at least two drive shafts to be the registered condition at the direct-front position.

4. The charged particle beam apparatus according to claim 2, wherein the GUI displays a second setting field to set a final magnification of an image to be acquired, and the imaging device is configured to be controlled to acquire image data at the final observation position in accordance with the final magnification set in the second setting field.

5. The charged particle beam apparatus according to claim 4, wherein the imaging device is configured to be controlled to image while increasing a magnification in a phased manner from a magnification at which the tilt image is captured to the final magnification.

6. The charged particle beam apparatus according to claim 4, wherein the computer system executes, to an image captured at an increased magnification that is increased from the given magnification, horizontal line correction processing using a processing to detect an edge line included in a cross section of the sample, and obtains an amount of rotational deviation of the image, and the imaging device performs, by adjustment of the sample stage or image shift, correction of field-of-view deviation attributed to the rotational deviation of the image.

7. The charged particle beam apparatus according to claim 6, wherein the computer system is configured to obtain an amount of field-of-view center deviation between before and after the magnification is increased, and the imaging device is configured to perform, by adjustment of the sample stage or image shift, correction of the field-of-view deviation.

8. The charged particle beam apparatus according to claim 6, wherein the computer system is configured to determine a correction amount in the field-of-view deviation correction, and in accordance with an excess or a deficiency in the correction amount, the computer system is configured to re-adjust the sample stage or re-execute the image shift.

9. The charged particle beam apparatus according to claim 5, wherein the imaging device is configured to be controlled to execute focus adjustment and astigmatism correction every time the magnification is increased.

10. The charged particle beam apparatus according to claim 5, wherein the computer system is configured to execute, to image data acquired through the imaging at the increased magnification, a processing to detect an edge line included in a cross section of the sample, and when the edge line is detected, the imaging device is configured to be controlled to increase the magnification without execution of focus adjustment and astigmatism correction, and execute imaging at a next magnification.

11. The charged particle beam apparatus according to claim 4, wherein the imaging device includes a scanner means capable of causing the charged particle beam to scan at least at a first scanning speed and a second scanning speed higher than the first scanning speed, the imaging device captures the tilt image at the second scanning speed, and the imaging device captures the image at the final magnification at the first scanning speed.

12. The charged particle beam apparatus according to claim 1, wherein the pseudo tilt image is generated by execution of an image style transfer processing to a three-dimensional model generated from the layout pattern data and including a certain cross section, the image style transfer processing utilizing image style information extracted from real image data of a part corresponding to the three-dimensional model.

13. The charged particle beam apparatus according to claim 1, wherein the computer system executes in the process of the field-of-view search:

a processing to display on the GUI a plurality of tilt images in each of which one or more feature parts are included within the field of view, and a processing to display a marker for emphasizing the feature part to be superimposed on each of the plurality of tilt images.

14. The charged particle beam apparatus according to claim 1, wherein the computer system executes coordinate alignment of a captured tilt image and the layout pattern data through linking of positional information of the feature part outputted by the captured tilt image being inputted into the classifier, and positional information of the feature part obtained from the layout pattern data.

15. The charged particle beam apparatus according to claim 14, wherein the tilt image is obtained while the sample stage is transferred from a position where a left end of a sample cross section is brought within the field of view, to a position where a right end of the sample cross section is brought within the field of view.

16. A charged particle beam apparatus, comprising:

an imaging device configured to acquire image data of a sample at a given magnification by radiating a charged particle beam to the sample;

a computer system configured to execute arithmetic processing for field-of-view search at the time of acquisition of the image data, by using the image data; and a display unit on which a graphical user interface (GUI) to input a setting parameter for the field-of-view search is displayed, wherein the imaging device is provided with a sample stage configured to be capable of transferring the sample by at least two drive shafts, and shifting an imaging field of view corresponding to positional information of the sample, the positional information being obtained by the computer system, the computer system includes:

a first classifier configured to output positional information of one or more first feature parts existing in the image data; and a second classifier configured to output positional information of one or more second feature parts existing in the image data, the first classifier and the second classifier are trained in advance by using training data in which input is image data captured at a first magnification, and output is positional information of the first feature part or the second feature part, and the imaging device is configured to perform:

in a field of view including the first feature part and a field of view including the second feature part, the field of view being shifted by the sample stage, a processing to increase the field of view to be a second magnification higher than the first magnification; and in the field of view increased to be the second magnification, a processing to radiate the charged particle beam to the first feature part or the second feature part to sequentially execute elementary analysis.

17. The charged particle beam apparatus according to claim 16, wherein the computer system obtains an amount of field-of-view center deviation caused by increasing the magnification from the first magnification to the second magnification, and the imaging device is configured to perform, by adjustment of the sample stage or image shift, correction of the field-of-view deviation.

* * * * *